US009917592B2

(12) United States Patent
Yano et al.

(10) Patent No.: US 9,917,592 B2
(45) Date of Patent: Mar. 13, 2018

(54) ATOMIC OSCILLATOR, METHOD OF DETECTING COHERENT POPULATION TRAPPING RESONANCE AND MAGNETIC SENSOR

(71) Applicants: Yuichiro Yano, Tokyo (JP); Shigeyoshi Goka, Tokyo (JP)

(72) Inventors: Yuichiro Yano, Tokyo (JP); Shigeyoshi Goka, Tokyo (JP)

(73) Assignees: RICOH COMPANY, LTD., Tokyo (JP); Tokyo Metropolitan University, Municipal University Corp., Tokyo (JP)

( * ) Notice: Subject to any disclaimer, the term of this patent is extended or adjusted under 35 U.S.C. 154(b) by 317 days.

(21) Appl. No.: 14/817,605

(22) Filed: Aug. 4, 2015

(65) Prior Publication Data

US 2015/0338476 A1  Nov. 26, 2015

Related U.S. Application Data

(62) Division of application No. 14/176,555, filed on Feb. 10, 2014, now Pat. No. 9,136,851.

(30) Foreign Application Priority Data

Feb. 14, 2013 (JP) .................................. 2013-026436
Jan. 16, 2014 (JP) .................................. 2014-006073

(51) Int. Cl.
*G01R 33/26* (2006.01)
*H01S 3/10* (2006.01)
(Continued)

(52) U.S. Cl.
CPC ................. *H03L 7/26* (2013.01); *G01R 33/26* (2013.01); *G04F 5/145* (2013.01); *H01S 3/10* (2013.01); *H03B 17/00* (2013.01)

(58) Field of Classification Search
CPC ............ G01R 33/02; G01R 33/26; H01S 3/10
See application file for complete search history.

(56) References Cited

U.S. PATENT DOCUMENTS 3,165,705 A    1/1965  Dicke
3,513,381 A *  5/1970  Happer, Jr. ............ G01R 33/26
                                                      324/304
(Continued)

FOREIGN PATENT DOCUMENTS

CN     101800545 A    8/2010
JP     2009-129955    6/2009
(Continued)

OTHER PUBLICATIONS

Mar. 2, 2016 Chinese official action (and English translation thereof) in connection with Chinese Patent Application No. 201410151191.1.

(Continued)

*Primary Examiner* — Levi Gannon
(74) *Attorney, Agent, or Firm* — Cooper & Dunham LLP

(57) ABSTRACT

An atomic oscillator includes an alkali metal cell encapsulating an alkali metal atom; a light source that emits laser light; a light detector that detects light which has passed through the alkali metal cell; and a polarizer arranged between the alkali metal cell and the light detector. A modulation frequency in the light source is controlled, according to a coherent population trapping resonance which is a light absorption characteristic of a quantum interference effect for two kinds of resonant lights, by modulating the light source to generate sidebands and injecting laser lights with the sidebands into the alkali metal cell. A magnetic field is applied on the alkali metal cell in a direction parallel to a propagating direction of the laser light, and the laser light entering the alkali metal cell has a linear (Continued)

polarization, which is not parallel to a polarization direction of the polarizer.

5 Claims, 23 Drawing Sheets

(51) Int. Cl.
  *H03L 7/26* (2006.01)
  *H03B 17/00* (2006.01)
  *G04F 5/14* (2006.01)

(56) References Cited

U.S. PATENT DOCUMENTS

| | | | | |
|---|---|---|---|---|
| 3,740,151 | A * | 6/1973 | Chaney | G01N 21/1717 250/225 |
| 6,993,058 | B2 | 1/2006 | Zhu | |
| 7,102,451 | B2 * | 9/2006 | Happer | G01R 33/26 331/94.1 |
| 7,323,941 | B1 | 1/2008 | Happer et al. | |
| 7,501,906 | B2 | 3/2009 | Dimarcq et al. | |
| 7,911,611 | B2 | 3/2011 | Chindo | |
| 9,726,626 | B2 * | 8/2017 | Smith | G01N 24/006 |
| 9,726,733 | B2 * | 8/2017 | Smith | G01R 33/26 |
| 2009/0128820 | A1 | 5/2009 | Nomura | |
| 2010/0188081 | A1 * | 7/2010 | Lammegger | G01R 33/032 324/304 |
| 2010/0201452 | A1 | 8/2010 | Aoyama et al. | |
| 2010/0321117 | A1 | 12/2010 | Gan | |
| 2011/0025323 | A1 * | 2/2011 | Budker | G01R 33/26 324/304 |
| 2011/0057737 | A1 * | 3/2011 | Aoyama | G04F 5/145 331/94.1 |
| 2013/0003766 | A1 | 1/2013 | Savchenkov et al. | |
| 2014/0247045 | A1 * | 9/2014 | Kornack | G01R 33/26 324/304 |
| 2014/0347140 | A1 | 11/2014 | Gu et al. | |
| 2014/0355640 | A1 | 12/2014 | Yun et al. | |

FOREIGN PATENT DOCUMENTS

| | | |
|---|---|---|
| JP | 2010-263593 | 11/2010 |
| JP | 4801044 | 10/2011 |
| JP | 2012-191523 | 10/2012 |

OTHER PUBLICATIONS

Yang et al., 'Research on Miniaturized CPT Atomic Clock Principles with Parallel Linearly Polarized Bichronmatic Light Fields,' 2011 National Time Frequency Academic Conference, 2012.

R. Lutwak et al., "The Chip-Scale Atomic Clock— Recent Development Progress", 35th Annual Precise Time and Time Interval (PTTI) Meeting, pp. 467-478, 2002.

P. M. Anisimov et al., "Influence of Transverse Magnetic Fields and Depletion of Working Levels on the Nonlinear Resonance Faraday Effect", Journal of Experimental and Theoretical Physics, vol. 97, No. 5, pp. 868-874, Feb. 2003.

D.A. Steck, "Cesium D Line Data", http://steck.us/alkalidata, Dec. 18, 2012.

G. Kazakov et al., "Pseudoresonance mechanism of all-optical frequency-standard operation", Physical Review A 72, 063408 2005.

P. D. D. Schwindt et al., "Chip-scale atomic magnetometer", Applied Physics Letters, vol. 85, No. 26, 6409, 2004.

European search report dated Dec. 5, 2017 in connection with corresponding European patent application No. 14154882.6.

R. Boudot, S. Guerandel, E. de Clercq, N. Dimarcq and A. Clairon, "Current Status of a Pulsed CPT Cs Cell Clock," IEEE Transactions on Instrumentation and Measurement, vol. 58, No. 4, pp. 1217-1222, Apr. 2009.

* cited by examiner

ATOMIC OSCILLATOR, METHOD OF DETECTING COHERENT POPULATION TRAPPING RESONANCE AND MAGNETIC SENSOR

CROSS-REFERENCE TO RELATED APPLICATIONS

This application is a divisional of U.S. application Ser. No. 14/176,555 filed on Feb. 10, 2014, which claims the priority of Japanese Patent Application Nos. 2013-026436 and 2014-006073 filed with the Japanese Patent Office on Feb. 14, 2013 and Jan. 16, 2014, respectively.

BACKGROUND OF THE INVENTION

1. Field of the Invention

The disclosures herein generally relate to an atomic oscillator, a method of detecting a CPT (Coherent Population Trapping) resonance and a magnetic sensor.

2. Description of the Related Art

An atomic clock (an atomic oscillator) is an extremely accurate clock. Technologies for reducing the size of the atomic clock are being studied. The atomic clock is an oscillator based on transition energy of an electron included in an atom of alkali metal or the like. Especially, electron transition energy of an alkali metal atom is found to be quite accurate if the process is not influenced by any disturbance. Accordingly, stability of frequency, which has been improved by more than several orders of magnitude compared with a crystal oscillator, can be obtained.

There have been several types of atomic oscillators. For example, an atomic oscillator having a structure of a microwave oscillator of the related art has a large size and requires large amount of electric power. On the other hand, a CPT (Coherent Population Trapping) type atomic oscillator provides stability of frequency, precision of which is higher by three orders of magnitude than that of the crystal oscillator of the related art. Furthermore, it is hoped that size and power consumption of the CPT type atomic oscillator can be reduced. A prototype of the CPT type atomic oscillator was manufactured in 2007, and products of the CPT type atomic oscillator have been sold by Symmetricom, Inc., U.S.A. since 2011.

U.S. Pat. No. 6,993,058 discloses a CPT detector and a method for detecting CPT. The CPT detector includes a quantum absorber, a polarization analyzer, and a detector. The quantum absorber includes a material having first and second low energy states coupled to a common high energy state. Transitions between the first low energy state and the common high energy state and between the second low energy state and the common high energy state are induced by electromagnetic radiation having a predetermined polarization state. The polarization analyzer blocks electromagnetic radiation of the predetermined polarization while passing electromagnetic radiation having a polarization state that is orthogonal to the predetermined polarization. The polarization analyzer is irradiated with a portion of the generated electromagnetic radiation that has passed through the quantum absorber. The detector generates a signal related to the intensity of electromagnetic radiation that leaves the polarization analyzer.

Japanese Published Patent Application No. 2010-263593 discloses an optical system of an atomic oscillator that regulates an oscillation frequency by using an optical absorption property by one of a double resonance method utilizing light and micro waves and a coherent population trapping (CPT) method utilizing a quantum interference effect produced by two kinds of resonance light. The optical system includes a light source emitting the resonance light; a gas cell disposed at an emitting side of the light source, sealing a gaseous metal atom therein and transmitting the resonance light through a metal atom gas; a light detecting unit detecting the transmitted light that is transmitted through the metal atom gas; and a fluorescence blocking unit blocking at least a part of fluorescence, which is emitted from the metal atom gas to the light detecting unit, and disposed between the metal atom gas and the light detecting unit.

Japanese Patent No. 4801044 discloses a method for modulating an atomic clock signal and a corresponding atomic clock. The laser beams (L1, L2) are pulse-modulated in amplitude to illuminate (A) an interactive medium. A detection (B) of the current pulse (Sr) and of the pulses (Sr-1 to Sr-p) preceding said current impulsion is performed. The pulses are superimposed (C) by linear combination to generate a compensated atomic clock signal (SHC) whereof the spectral width is minimized. The invention is applicable to atomic clocks with pulsed interrogation whereof the interactive medium consists of thermal or laser-cooled atoms.

P. M. Anisimov, et al., "Influence of transverse magnetic fields and depletion of working levels on the nonlinear resonance Faraday effect", Journal of Experimental and Theoretical Physics, November 2003, Volume 97, Issue 5, pp 868-874 discloses the nonlinear resonance Faraday effect studied under the condition of coherent population trapping in $^{87}$Rb vapor at the $D_1$-line F=2 to F'=1 transition. The influence of transverse magnetic fields on the nonlinear optical Faraday rotation is studied. For the transverse fields perpendicular to the electromagnetic-wave polarization, a simple theoretical model is proposed, which is in good agreement with experimental data. The optimal intensity providing the maximum sensitivity is found based on the results obtained. The influence of working-level depletion on the parameters of Faraday rotation in open systems is studied experimentally and theoretically. The system was closed in the experiment by using an additional laser to increase the sensitivity and extend the dynamic range of measured fields.

G. Kazakov, et al., "Pseudoresonance mechanism of all-optical frequency-standard operation", Phys. Rev. A 72, 063408 (2005) proposes an approach to all-optical frequency standard design, based on a counterintuitive combination of the coherent population trapping effect and signal discrimination at the maximum of absorption for the probe radiation. The short-term stability of such a standard can achieve the level of $10^{-14}/\sqrt{\tau}$.

Data used in the present application are available at http://steck.us/alkalidata/ by D. A. Steck, Dec. 18, 2012.

SUMMARY OF THE INVENTION

It is a general object of at least one embodiment of the present invention to provide an atomic oscillator, a method of detecting a CPT resonance and a magnetic sensor that provides a high stability of frequency.

In one embodiment of the present invention, an atomic oscillator includes an alkali metal cell, in which an alkali metal atom is encapsulated; a light source that emits laser light, which enters the alkali metal cell; a light detector that detects light, which has passed through the alkali metal cell; and a polarizer arranged between the alkali metal cell and the light detector. A modulation frequency in the light source is controlled, according to a coherent population trapping resonance, which is a light absorption characteristic of a quantum interference effect for two kinds of resonant lights, by modulating the light source to generate sidebands and injecting laser lights with two different wavelengths which are the sidebands into the alkali metal cell, wherein a magnetic field is applied on the alkali metal cell in a direction parallel to a propagating direction of the laser light, the laser light entering the alkali metal cell has a linear polarization, and a direction of polarization of the laser light is not parallel to a direction of polarization of the polarizer.

In another embodiment of the present invention, a method of detecting a coherent population trapping resonance, in an atomic oscillator including an alkali metal cell, in which an alkali metal atom is encapsulated, a light source that emits laser light, which enters the alkali metal cell, a light detector that detects light, which has passed through the alkali metal cell, and a polarizer arranged between the alkali metal cell and the light detector, wherein a modulation frequency in the light source is controlled, according to the coherent population trapping resonance, which is a light absorption characteristic of a quantum interference effect for two kinds of resonant lights, by modulating the light source to generate sidebands, and injecting laser lights with two different wavelengths which are the sidebands into the alkali metal cell, and a magnetic field is applied on the alkali metal cell in a direction parallel to a propagating direction of the laser light, wherein the method includes injecting the laser light, which has a linear polarization, into the alkali metal cell; and detecting a laser light which has passed through the alkali metal cell by the light detector. A direction of polarization of the laser light is not parallel to a direction of polarization of the polarizer.

In yet another embodiment of the present invention, a magnetic sensor includes an alkali metal cell, in which an alkali metal atom is encapsulated; a light source that emits laser light, which enters the alkali metal cell; a light detector that detects light, which has passed through the alkali metal cell; and a polarizer arranged between the alkali metal cell and the light detector. A modulation frequency in the light source is controlled, according to a coherent population trapping resonance, which is a light absorption characteristic of a quantum interference effect for two kinds of resonant lights, by modulating the light source to generate sidebands, and injecting laser lights with two different wavelengths which are the sidebands into the alkali metal cell, wherein the laser light entering the alkali metal cell has a linear polarization, a direction of polarization of the laser light is not parallel to a direction of polarization of the polarizer, and a density of magnetic flux in a direction parallel to a propagating direction of the laser light is detected in response to the coherent population trapping resonance.

According to the present invention, a CPT type atomic oscillator with high stability of frequency, a method of detecting a CPT resonance, and a magnetic sensor are provided.

BRIEF DESCRIPTION OF THE DRAWINGS

Other objects and further features of embodiments will be apparent from the following detailed description when read in conjunction with the accompanying drawings, in which.

DESCRIPTION OF THE PREFERRED EMBODIMENTS

In the following, embodiments of the present invention will be described with reference to the accompanying drawings. Meanwhile, the same numerical symbols are assigned to the same members, and duplicate explanation is omitted.

First Embodiment

Figure 1:
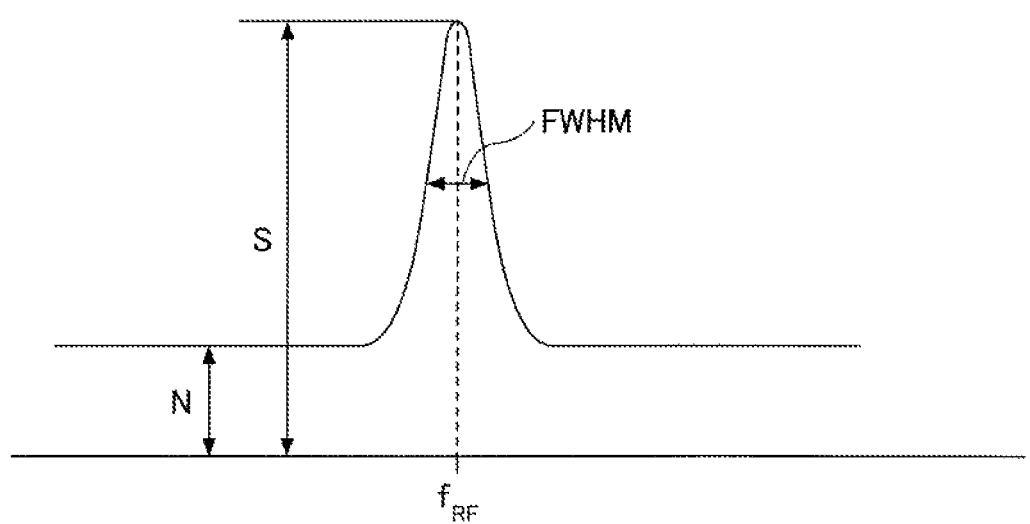
FIG. 1 is an explanatory diagram illustrating an example of CPT resonance.

Generally, high stability of frequency is required for the atomic oscillator. Especially, in the case of using the atomic oscillator as a reference source for a base station in various wireless communication systems, short-time stability is quite important. FIG. 1 is an explanatory diagram illustrating an example of CPT (Coherent Population Trapping) resonance. The short-time stability $\sigma_y(\tau)$ is expressed by formula 1, using the Allan standard deviation, which is used for an index of the stability of frequency.

$$\sigma_y \propto \frac{1}{Q(S/N)\sqrt{\tau}} \quad \text{Formula 1}$$

In formula 1, $\tau$ is an integrated time, and S/N is a signal to noise ratio. Moreover, Q is a resonance Q value in the atomic resonance, and is expressed by formula 2, where $f_{RF}$ represents the RF (radio frequency) frequency and FWHM (full width at half maximum) is a full width of the resonance at half the maximum height, i.e. at the resonance frequency, $f_{RF}$.

$$Q = \frac{f_{RF}}{FWHM} \quad \text{Formula 2}$$

Specifically, S/N represents a ratio of an intensity of the RF frequency at $f_{RF}$ to noise. In the present embodiment, the ratio S/N is also denoted "contrast Ct" in the following.

The short-time stability of frequency $\sigma_y(\tau)$ is further expressed by formula 3 where K is a constant.

$$\sigma_y(\tau) = K \frac{FWHM}{Ct \cdot f_{RF}} = \frac{K}{Q \cdot Ct} \quad \text{Formula 3}$$

According to the relationship expressed in formula 3, the short-time stability $\sigma_y(\tau)$ is found to depend on the resonance Q value of the atomic resonance and on the contrast Ct (S/N ratio). That is, by increasing the resonance Q value or the contrast Ct, smaller short-time stability $\sigma_y(\tau)$ can be obtained, i.e. the frequency becomes stable. However, in exciting the CPT resonance, large resonance amplitude may be obtained by increasing an intensity of laser light for excitation, but at the same time the line width may broaden according to a power broadening effect. Accordingly, in general, increasing the resonance Q value and increasing the contrast Ct (S/N ratio) have a trade-off relationship with each other.

The stability of the atomic oscillator according to the present embodiment is enhanced by increasing the contrast Ct (S/N ratio), not the resonance Q value.

(Atomic Oscillator)

Next, a configuration of the atomic oscillator according to the present embodiment will be described with reference to FIG. 2. The atomic oscillator according to the present embodiment includes a laser light source 110, a collimation lens 120, a first polarizer 131, a second polarizer 132, an alkali metal cell 140, and a light detector 150. In the atomic oscillator according to the present embodiment, laser lights with two different sideband wavelengths are generated by modulating the frequency in the laser light source 110, and the laser lights with the sideband wavelengths are injected into the alkali metal cell 140.

When the wavelength of the laser light corresponds to excitation energy in the alkali metal atom, the laser light excites the alkali metal atom up to the excited state (resonant light). In the case that two resonance lights with different wavelengths can excite the alkali metal atom up to the same excited state from a first state and from a second state, respectively, the two resonance lights interfere with each other and a "non-coupled" state is formed by combining the first state and the second state. The "non-coupled" state is decoupled from the exited state, i.e. some of the alkali metal atoms are "trapped" in the "non-coupled" state (the "quantum interference effect"), and these atoms do not interact with light (Coherent Population Trapping (CPT) state). When the wavelengths of the laser lights satisfy the condition for the CPT, the absorption of light by the alkali metal atoms decreases, and a resonance peak appears in the spectrum. In the present embodiment, by observing the CPT resonance in the spectrum, the modulation frequency for the laser light source 110 is controlled.

The laser light source 110 is a laser light source for excitation. In the present embodiment, a vertical cavity surface emitting laser (VCSEL) is employed. A laser light emitted from the laser light source 110 has a wavelength which is approximately the same as the wavelength of the $D_1$ line of cesium 133 ($^{133}$Cs). The VCSEL is preferable, since the small-sized VCSEL can emit laser light at low power, and the power consumption of the atomic oscillator can be lowered.

The alkali metal cell 140, for example, has a shape of a cylinder with a diameter of 22.5 mm and a light path length of 20.0 mm. In the alkali metal cell 140, alkali atoms of cesium (Cs) and buffer gas of neon (Ne) are encapsulated. An internal pressure of the alkali metal cell 140 is about 4.0 kPa.

In the present embodiment, the laser light emitted from the laser light source 110 becomes a laser light with a beam diameter of about 5 mm by passing though the collimation lens 120 and the first polarizer 131, and enters into the alkali metal cell 140. The laser light, which has passed through the alkali metal cell 140, further passes through the second polarizer 132 and is detected by the light detector 150, which includes a photo diode or the like.

In the present embodiment, a lock-in amplifier 161 performs a lock-in detection for the laser light emitted from the laser light source 110, and the electric current, which drives the VCSEL as the laser light source 110, is controlled by the current drive 162 or the like. According to the above control, the wavelength of the laser light emitted from the laser light source 110 is stabilized, so that the light absorbance by the alkali atoms in the alkali metal cell 140 is the maximum. Moreover, the VCSEL as the laser light source 110 is kept at constant temperature. In order to perform the above processes, a function generator 163 is connected to the rock-in amplifier 161 and the current driver 162.

Figure 3:
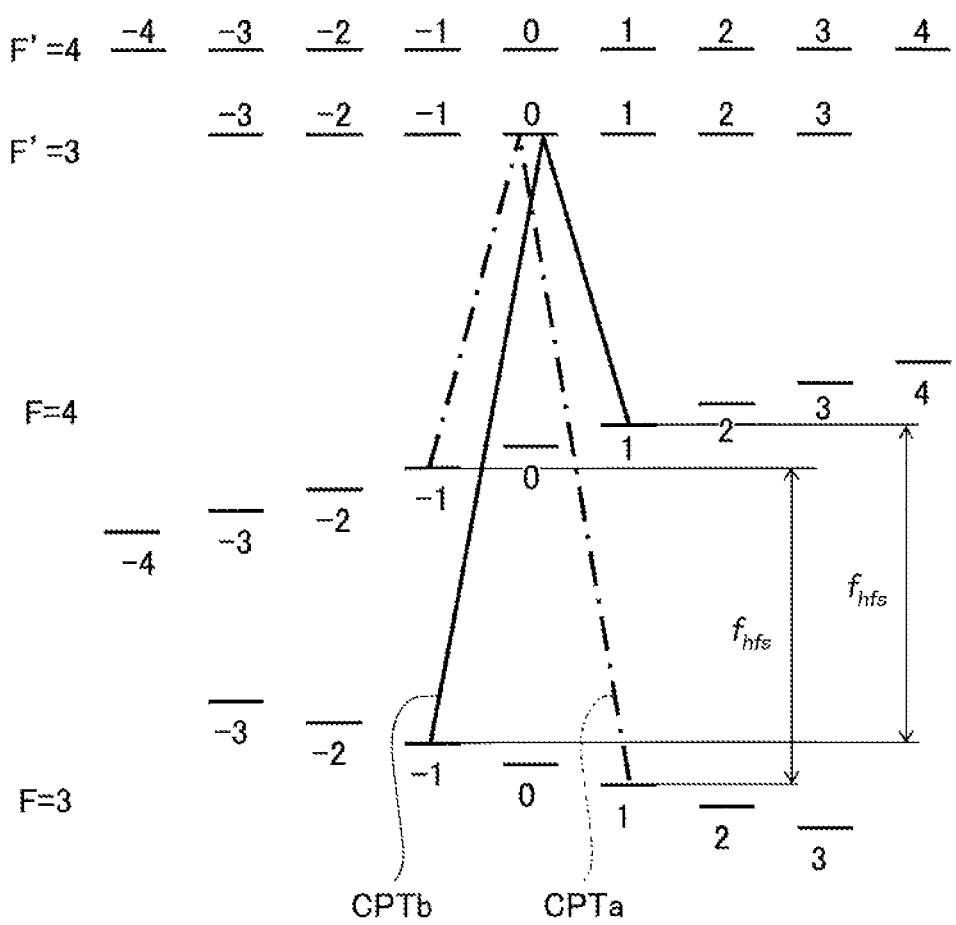
FIG. 3 is an explanatory diagram illustrating an example of the cesium 133 $D_1$ line data.

In order to measure the CPT resonance, which is less affected by magnetic fields, a Helmholtz coil (not shown) applies static magnetic field B (for example, 32 µT) to the alkali metal cell 140. The CPT resonance is extracted by using the effect of the Zeeman splitting. In order to block external magnetic field, such as the terrestrial magnetic fields, the alkali metal cell 140 and the Helmholtz coil are covered with a magnetic shield material. The alkali metal cell 140 and the Helmholtz coil are set inside a thermostatic bath, so as to keep the temperature constant. In the present embodiment, the temperature of the alkali metal cell 140 is kept between 30° C. and 55° C. Preferably, the temperature is kept at 42° C., at which the contrast of the CPT resonance becomes the highest value. In the present embodiment, the magnetic field B means a density of magnetic flux. The laser light for the CPT resonance excitation has a linear polarization applied by the first polarizer 131, in order to avoid deviation of the Zeeman sublevel. In the present embodiment, as shown in FIG. 3, two resonances, in which two CPT resonances are superimposed respectively, are observed. That is, a CPT resonance CPTa, in which resonance states |F=3, m=1⟩ and |F=4, m=−1⟩ are superimposed, shown by dot-dashed lines in FIG. 3, and a CPT resonance CPTb, in which resonance states |F=3, m=−1⟩ and |F=4, m=1⟩ are superimposed, shown by solid lines in FIG. 3, are observed, wherein F and m represent the total angular momentum quantum number and its projected quantum number, respectively.

Moreover, an output from the light detector 150, corresponding to light intensity of the detected laser light, is input into the control unit 173, which includes a personal computer (PC) or the like, through the DMM (Digital Multi Meter) 171 and the oscilloscope 172. A control signal is sent from the control unit 173 to the analog signal generator 174. Furthermore, as a reference frequency source for the detectors, a cesium primary frequency standard 175 is employed, which is connected to the analog signal generator 174.

In the atomic oscillator according to the present embodiment, a voltage with a RF (radio frequency) is applied to the VCSEL as the laser light source, and the VCSEL performs frequency modulation (FM). A laser light with the sideband wavelength raised by the frequency modulation is used for the generation of the CPT resonance. In such an atomic oscillator, increasing the contrast Ct (S/N ratio), in general, makes the optical system complicated. The complicated optical system requires a large sized atomic oscillator with high cost, which is not preferable.

Figure 4:
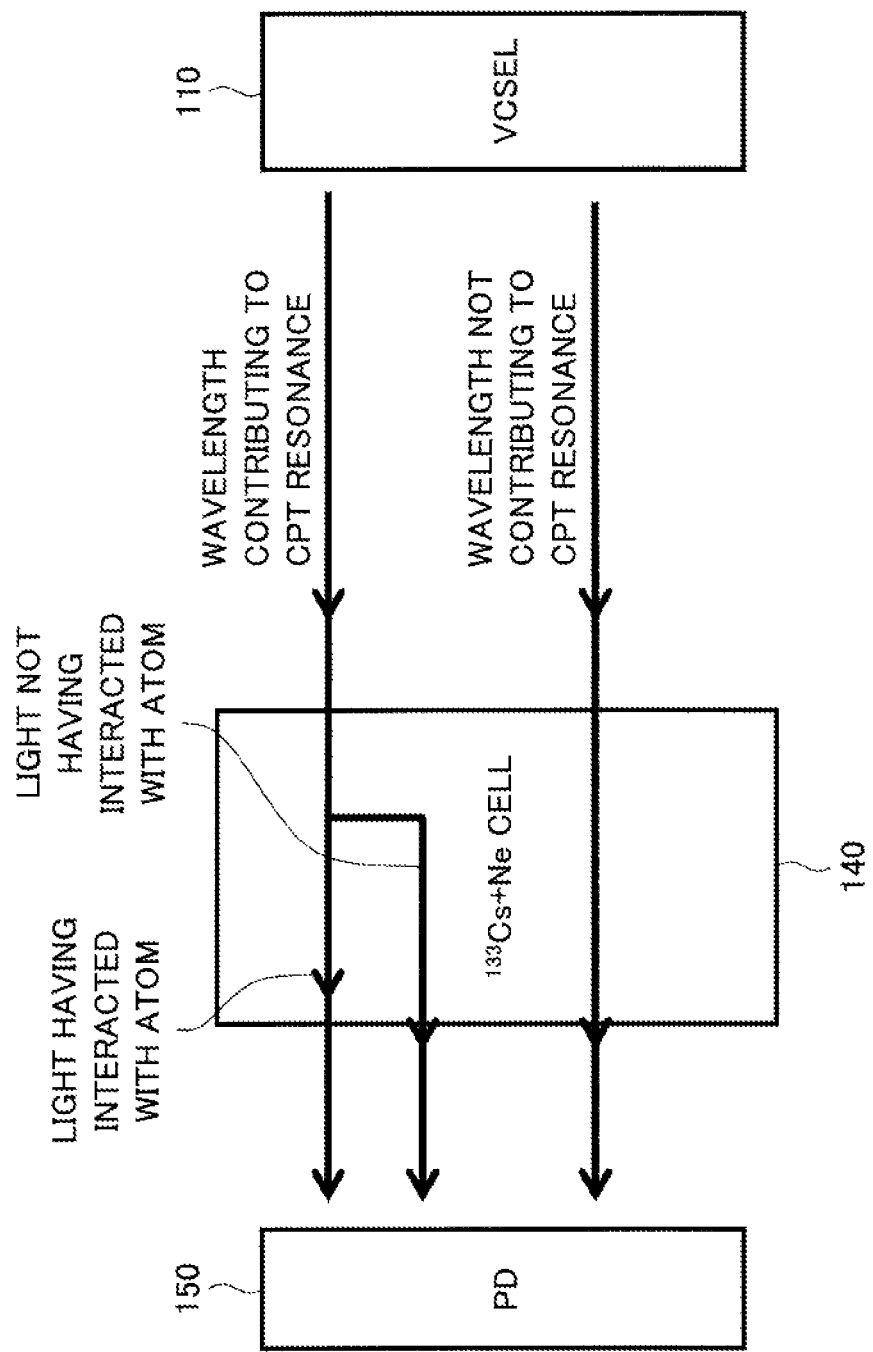
FIG. 4 is an explanatory diagram illustrating an aspect of transmission of laser light through an alkali metal cell.

Next, the reason why the contrast Ct (S/N ratio) cannot be increased in an atomic oscillator, in general, will be explained as follows. FIG. 4 is an explanatory diagram illustrating a transmission of the laser light through the alkali metal cell. In the atomic oscillator of the CPT type, a laser light emitted from the laser light source 110 is injected into the alkali metal cell 140. A part of the injected laser light, which has a wavelength contributing to the CPT resonance, interacts with the alkali metal in the alkali metal cell 140. The laser light, which interacts with the alkali metal in the alkali metal cell 140 in this way, is detected as a signal (S) at the light detector 150, such as a photo diode.

Figure 5:
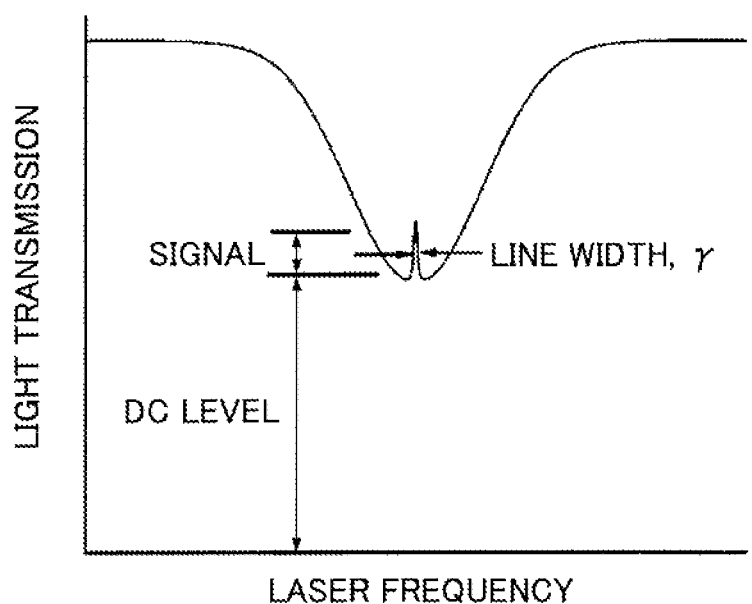
FIG. 5 is a correlation diagram illustrating an example of a correlation between a frequency and intensity of light detected by a light detector.

Moreover, laser light of the injected laser light, which has the wavelength contributing to the CPT resonance but does not interact with the alkali metal, and laser light with a wavelength which does not contribute to the CPT resonance, pass through the alkali metal cell 140. The laser light which has the wavelength contributing to the CPT resonance but does not interact with the alkali metal, and the laser light with the wavelength which does not contribute to the CPT resonance are detected at the light detector as a noise (N). When the component of laser light detected as a noise is large, the contrast is degraded. FIG. 5 shows a relationship between the frequency of the laser light entering the light detector 150 and the light intensity detected by the light detector 150.

Figure 6:
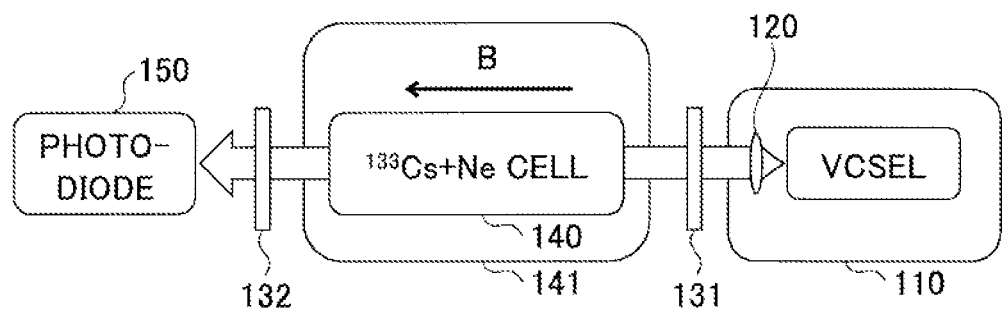
FIG. 6 is an explanatory diagram illustrating an aspect of the atomic oscillator according to the first embodiment.
Figure 7:
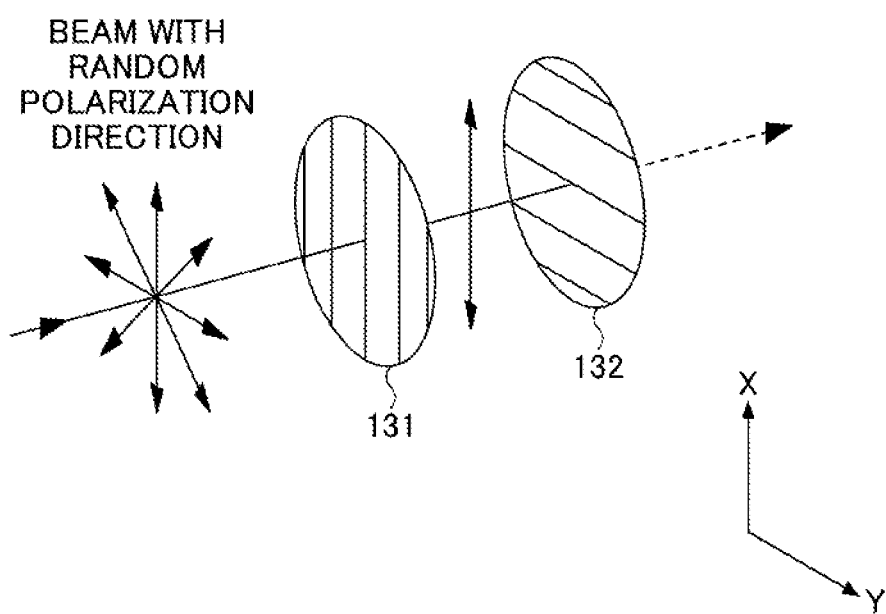
FIG. 7 is an explanatory diagram illustrating another aspect of the atomic oscillator according to the first embodiment.

FIG. 6 is an explanatory diagram illustrating the atomic oscillator according to the present embodiment. In the atomic oscillator, the first polarizer 131 is arranged between the laser light source 110 and the alkali metal cell 140, and the second polarizer 132 is provided between the alkali metal cell 140 and the light detector 150. FIG. 7 is another explanatory diagram illustrating the atomic oscillator according to the present embodiment. As shown in FIG. 7, the first polarizer 131 is provided so that a laser light of the injected laser light, having a polarization parallel to the X-axis, transmits. The second polarizer 132 is arranged so that a laser light of the injected laser light, having a polarization parallel to the Y-axis. That is, the first polarizer 131 and the second polarizer 132 are arranged, so that the polarization direction of the first polarizer 131 and the polarization of the second polarizer 132 are mutually perpendicular to each other.

Figure 8:
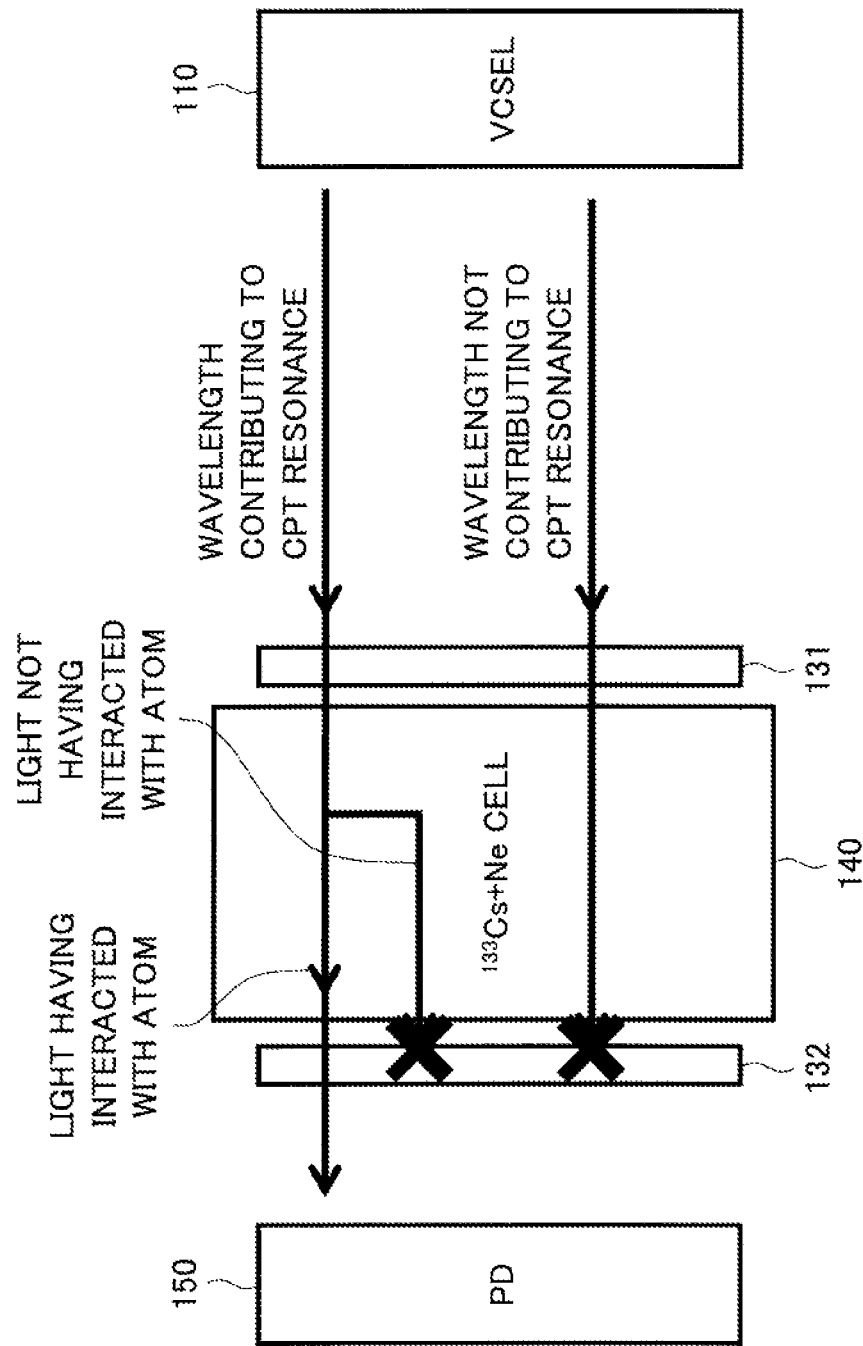
FIG. 8 is an explanatory diagram illustrating another aspect of the transmission of laser light through the alkali metal cell.

A part of the laser light having passed through the first polarizer 131 and injected into the alkali metal cell 140, which interacts with the alkali metal atoms in the alkali metal cell 140, receives the Faraday effect, according to the interaction with the alkali metal atoms. A part of the laser light which receives the Faraday effect, since the polarization direction rotates according to the Faraday effect, passes through the second polarizer 132, as shown in FIG. 8, and is detected by the light detector 150. On the other hand, the laser light which has the wavelength contributing to the CPT resonance but does not interact with the alkali metal, and the laser light with the wavelength which does not contribute to the CPT resonance, do not pass through the second polarizer 132 and are not detected by the light detector 150, since the polarization direction does not change. In this way, in the present embodiment, the laser light which has the wavelength contributing to the CPT resonance but does not interact with the alkali metal, and the laser light with the wavelength which does not contribute to the CPT resonance, are not detected by the light detector 150. Accordingly, the noise can be reduced, and the signal-to-noise (SN) ratio can be improved.

(Influence by Applied Magnetic Field)

Figure 9:
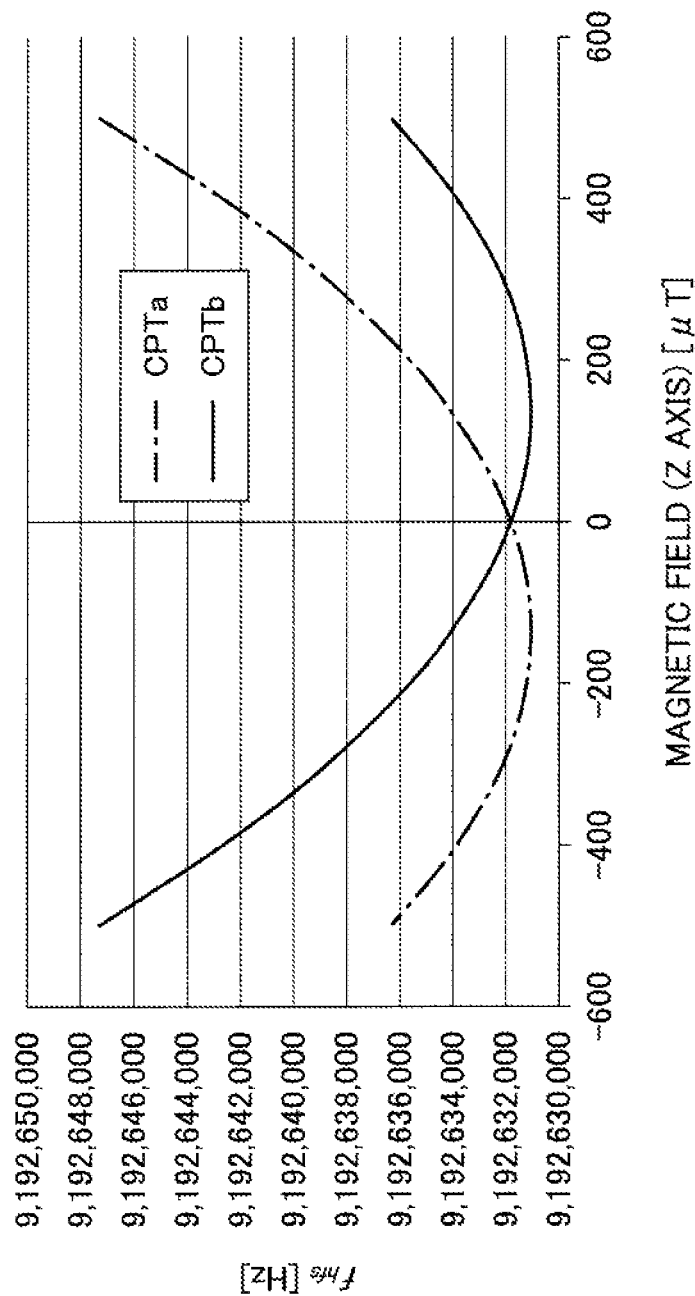
FIG. 9 is a correlation diagram illustrating a correlation between a magnetic field of the CPT resonance excited by a linear polarization and frequency.

FIG. 3, as explained above, is an energy level diagram illustrating the cesium 133 $D_1$ line data, and shows two CPT resonances, CPTa and CPTb, which are excited by laser light with the linear polarization. That is, when the laser light with the linear polarization is injected into the alkali metal cell 140, the CPT resonance CPTa, shown by dot-dashed lines and the CPT resonance CPTb, shown by solid lines, are excited. A signal, in which two CPT resonances CPTa and CPTb overlap each other, is observed, as shown in FIG. 9. FIG. 9 illustrates a relationship between the density of the magnetic flux applied to the alkali metal cell 140 and the frequency $f_{hfs}$, which is a frequency difference (hyperfile splitting (hfs)) between two sublevels contributing to each of the CPT resonances, as shown in FIG. 3. Moreover, the static magnetic field is applied on the alkali metal cell 140 so that the magnetic flux is parallel to the propagation direction of the laser light entering the alkali metal cell 140.

Figure 10:
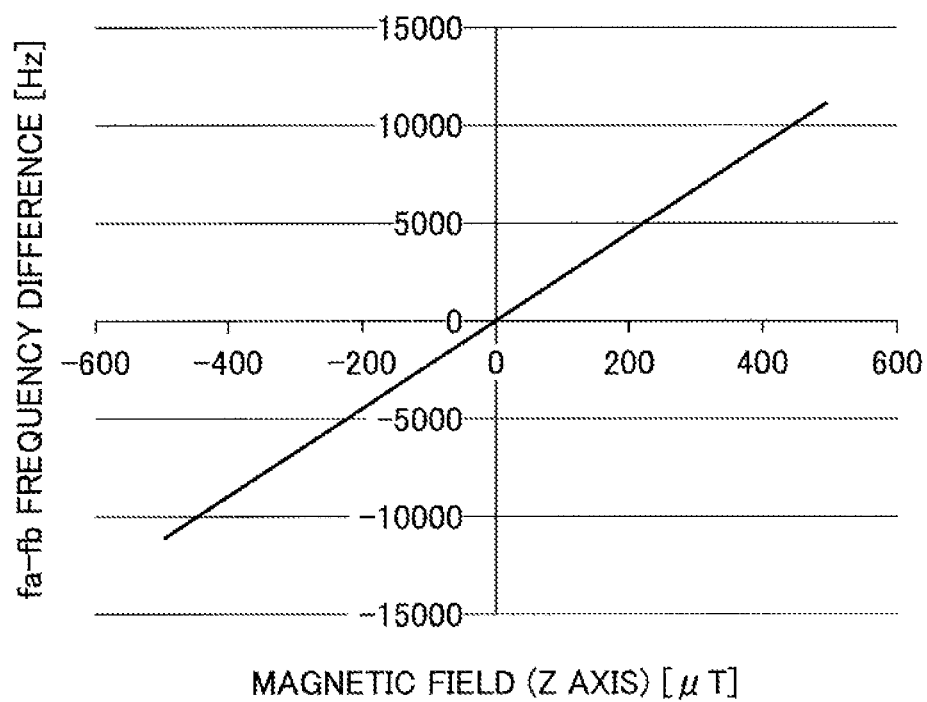
FIG. 10 is a correlation diagram illustrating a correlation between the magnetic field of the CPT resonance excited by the linear polarization and a frequency difference.
Figure 11:
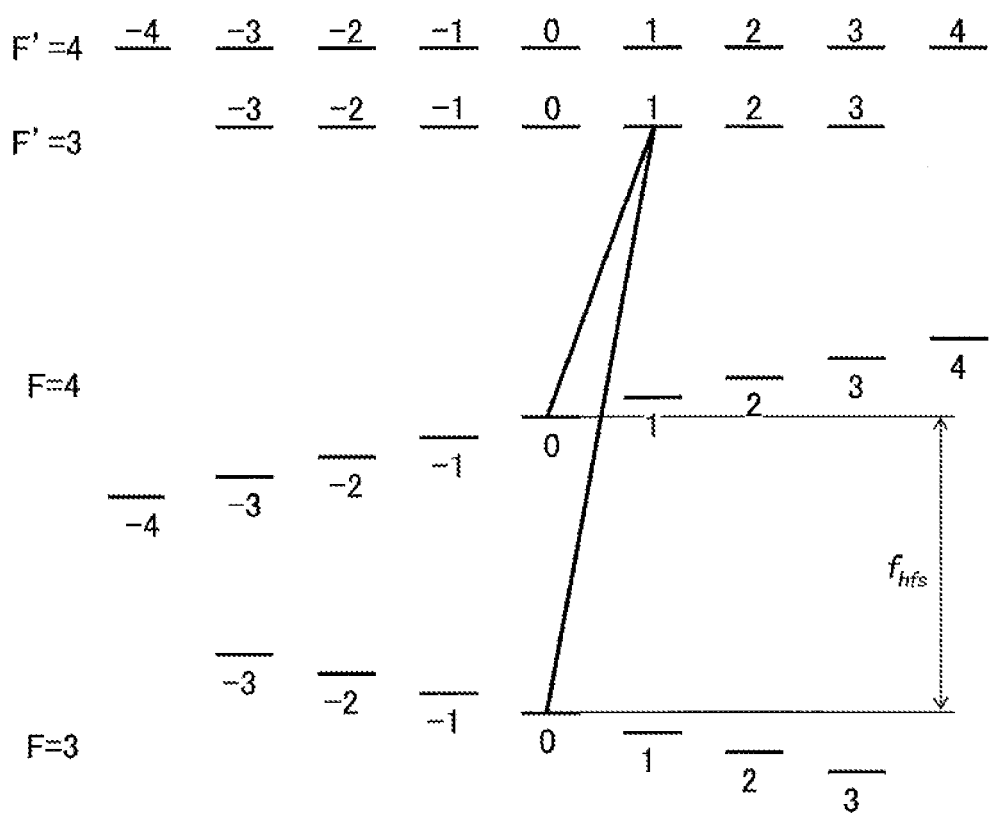
FIG. 11 is an explanatory diagram illustrating another aspect of the cesium 133 $D_1$ line data.

Moreover, as shown in FIG. 10, the density of the magnetic flux is proportional to a difference $f_a-f_b$ between the frequencies of the two CPT resonances, CPTa and CPTb. By increasing the density of the magnetic flux, the frequency difference $f_a-f_b$ of the two CPT resonances can be enlarged. Accordingly, in order to detect precisely the frequency difference $f_a-f_b$, the density of the magnetic flux applied to the alkali metal cell 140 is preferably more than or equal to 10 µT. In the case of injecting a laser light with a circular polarization, only one CPT resonance is excited, as shown in FIG. 11.

The frequency difference $f_a-f_b$ of the two CPT resonances is related with the density of magnetic flux B by the relationship expressed by the formula 4. The frequency $f_a$ is the CPT resonance CPTa, shown by the dot-dashed lines in FIG. 3, and the frequency $f_b$ is the CPT resonance CPTb, shown by the solid lines in FIG. 3.

$$f_a - f_b = \frac{4g_I\mu_B}{h}B \qquad \text{Formula 4}$$

In formula 4, $\mu_B$ is the Bohr magneton where $\mu_B$=9.27400915 $10^{-24}$, $g_I$ is a nuclear magnetic g-factor of cesium 133 where $g_I$=−0.00039885395, and h is the Planck constant where h=6.62606896 $10^{-34}$.

Next, characteristics of the Faraday rotation will be explained with reference to FIGS. 12A to 14B. The Faraday rotational angles for negative density of magnetic flux B, no density, and positive density of magnetic flux B are shown in FIGS. 12A and 12B, 13A and 13B, and 14A and 14B, respectively. In the case of not applying a magnetic field, i.e. B=0, as shown in FIGS. 13A and 13B, contributions from the CPT resonance CPTa and from the CPT resonance CPTb cancel each other. As shown in FIG. 13B, change in the Faraday rotational angle for the CPT resonances CPTa and CPTb cannot be observed.

Figure 12A:
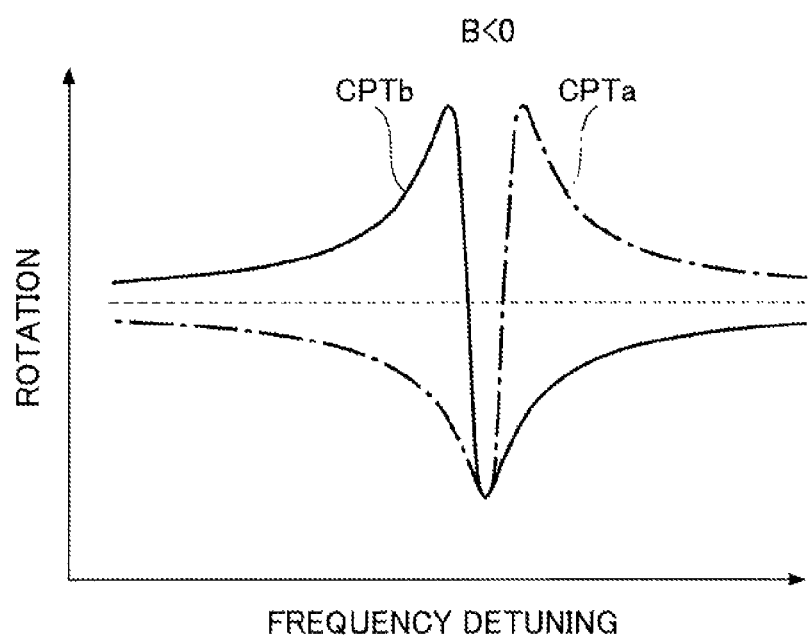
FIGS. 12A and 12B are diagrams illustrating an aspect of characteristics of a Faraday rotation in the atomic oscillator according to the first embodiment.
Figure 12B:
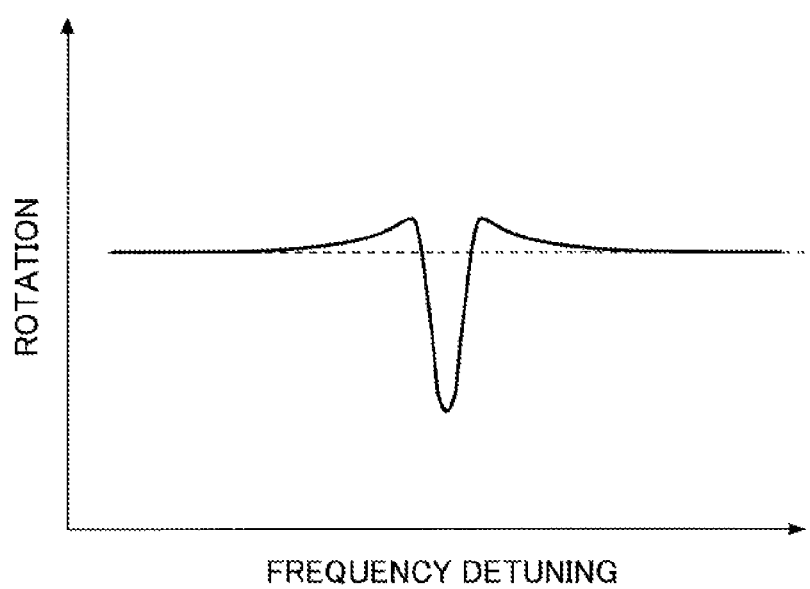
Figure 13A:
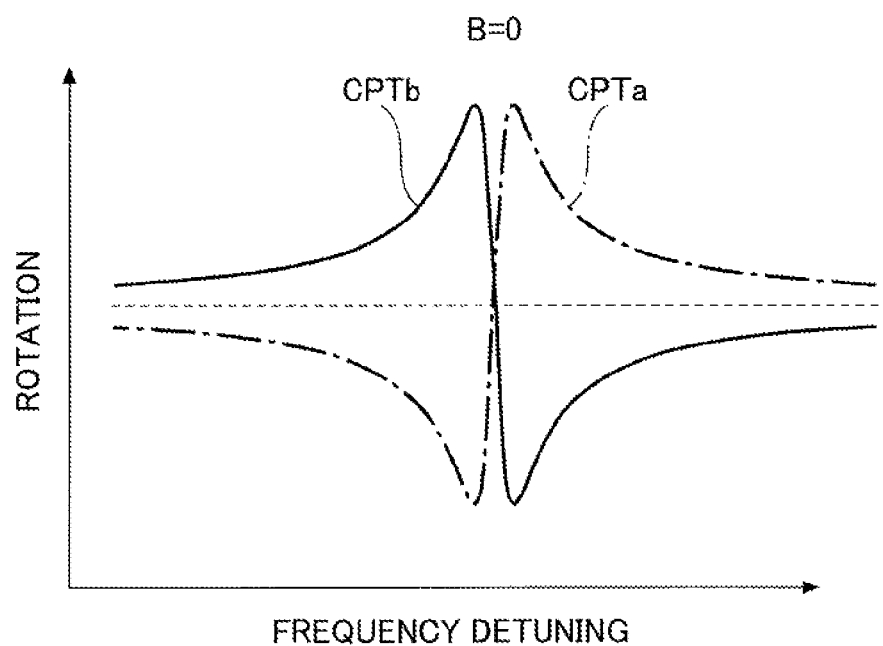
FIGS. 13A and 13B are diagrams illustrating another aspect of the characteristics of the Faraday rotation in the atomic oscillator according to the first embodiment.
Figure 13B:
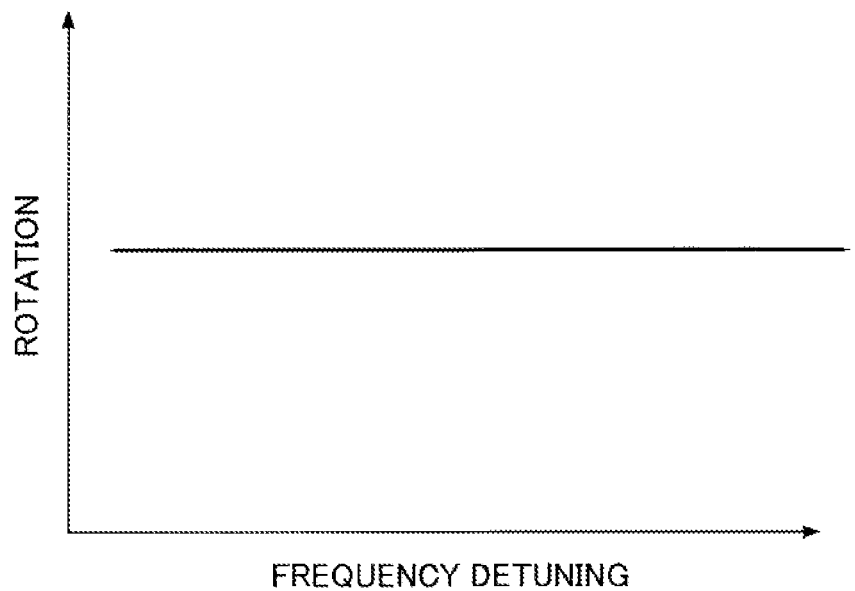
Figure 14A:
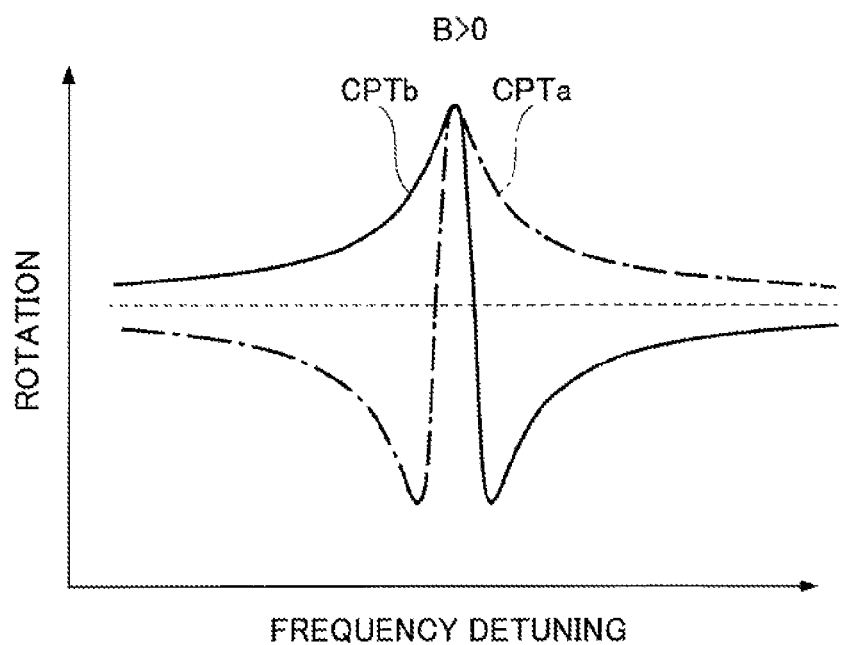
FIGS. 14A and 14B are diagrams illustrating yet another aspect of the characteristics of the Faraday rotation in the atomic oscillator according to the first embodiment.
Figure 14B:
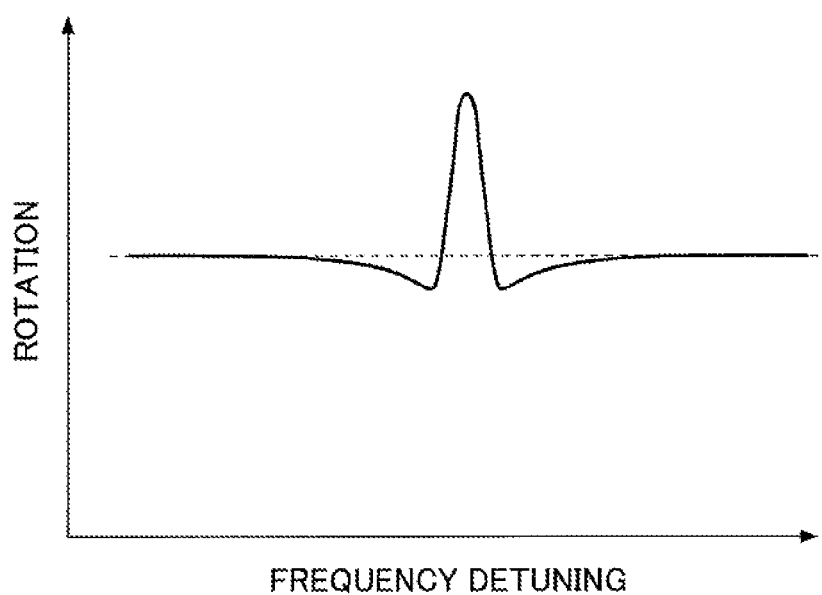

On the other hand, as shown in FIGS. 12A and 12B, where the value of the density of magnetic flux is negative, i.e. B<0, the Faraday effect on the CPT resonance CPTa and the Faraday effect on the CPT resonance CPTb overlap each other. FIG. 12B shows that the change in the Faraday rotational angle for the CPT resonances CPTa and CPTb becomes large at the specific frequency, which can be observed easily. Similarly, as shown in FIGS. 14A and 14*b*, where the value of the density of magnetic flux is positive, i.e. B>0, the Faraday effect on the CPT resonance CPTa and the Faraday effect on the CPT resonance CPTb overlap each other. FIG. 14B shows that the change in the Faraday rotational angle for the CPT resonances CPTa and CPTb becomes large at the specific frequency, which can be observed easily.

In the present embodiment, the polarization direction of the first polarizer 131 and the polarization direction of the second polarizer 132 are mutually perpendicular to each other. The present invention is not limited to the above, i.e. as long as the polarization directions of the first polarizer 131 and of the second polarizer 132 are different from each other, the same effect as the present embodiment may be obtained. Moreover, in the case that laser light emitted from the laser light source of the atomic oscillator has a linear polarization, only the second polarizer 132 may be arranged without arranging the first polarizer 131. In this case, the second polarizer 132 is arranged so that the polarization direction of the second polarizer 132 is different from the polarization direction of the laser light emitted from the laser light source 110. The polarization direction of the second polarizer 132 is preferably perpendicular to the polarization direction of the laser light emitted from the laser light source 110.

EXAMPLE

Figure 2:
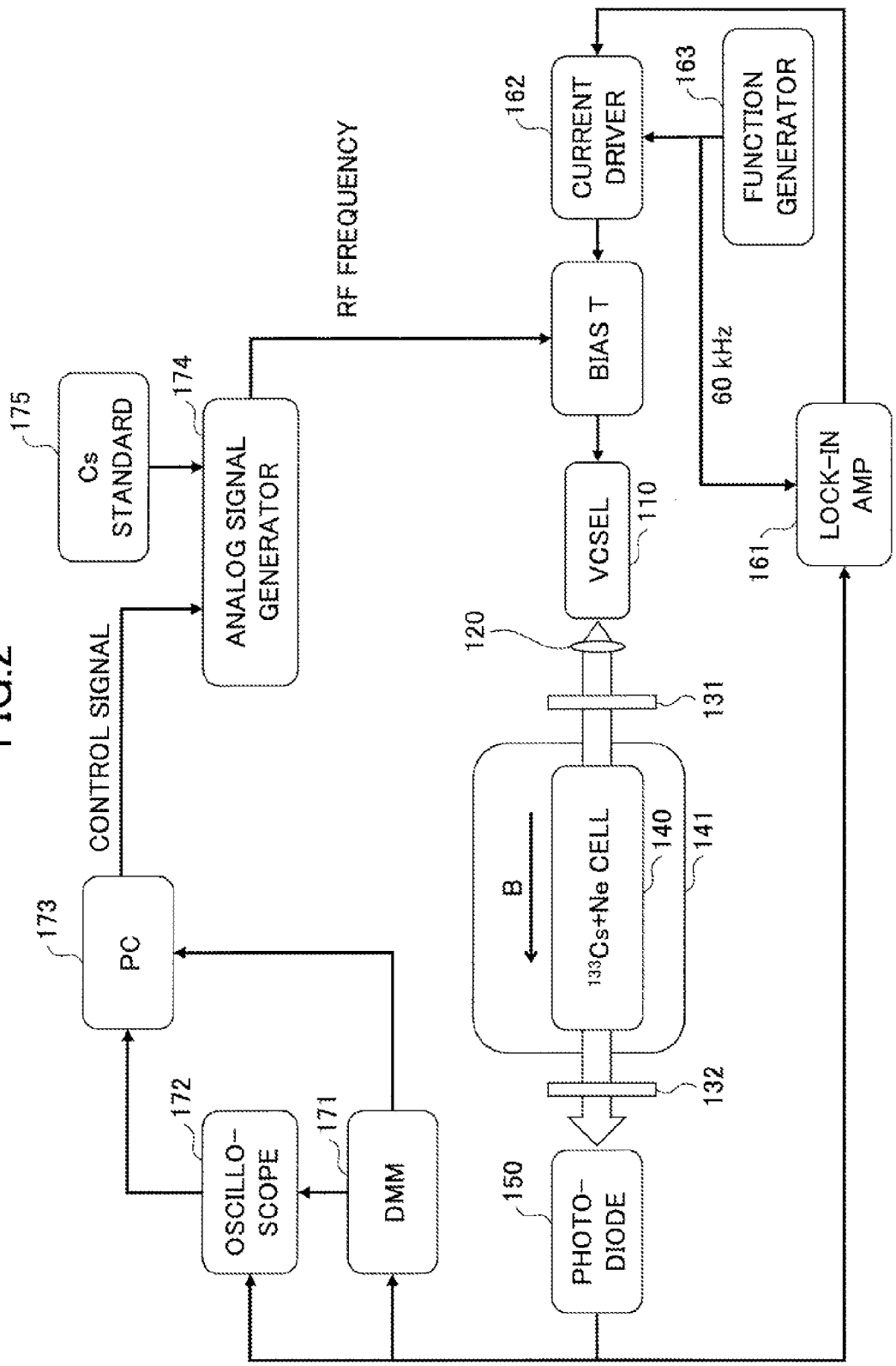
FIG. 2 is a configuration diagram illustrating an example of an atomic oscillator according to a first embodiment.

Next, as an example of the present embodiment, a measurement apparatus including the same configuration of the atomic oscillator shown in FIG. 2 is prepared, and CPT resonance is measured. A vertical cavity surface emitting laser (VCSEL) is used for the laser for excitation as the laser light source 110. A wavelength of laser light is the wavelength of the $D_1$ line of cesium 133, i.e. 895 nm. An intensity of the laser light entering the alkali metal cell 140 is 1.1 mW/cm². The alkali metal cell 140 has a shape of a cylinder with a diameter of 22.5 mm and a light path length of 20.0 mm. In the alkali metal cell 140 alkali atoms of cesium (Cs) and buffer gas of neon (Ne) are encapsulated. An internal pressure of the alkali metal cell 140 is 4 kPa. The laser light injected in the alkali metal cell 140 has a beam diameter of 5 mm. The laser light having entered the alkali metal cell 140 passes through the alkali metal cell and is detected by the light detector 150, which includes a photo diode or the like.

Figure 15:
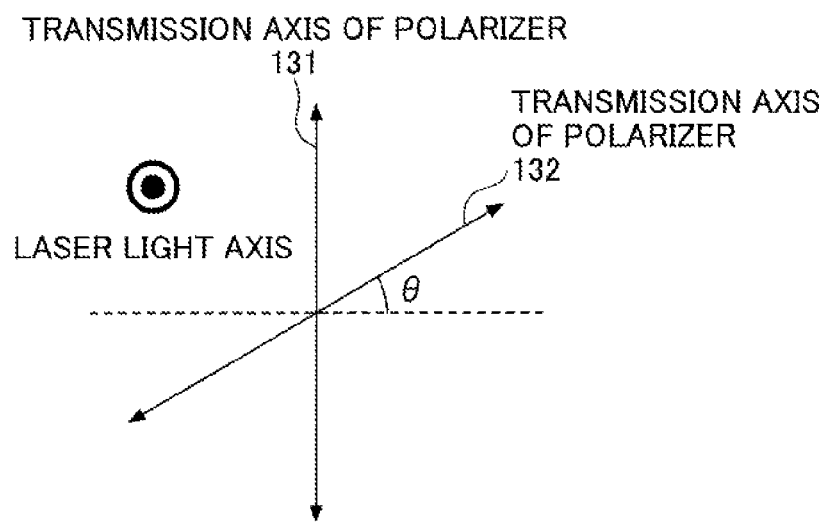
FIG. 15 is an explanatory diagram illustrating a positional relation between a first polarizer and a second polarizer.

The temperature of the VCSEL as the laser light source 110 is kept constant. In order to block external magnetic fields, such as the terrestrial magnetic field, the alkali metal cell 140 and a Helmholtz coil (not shown) are covered with a magnetic shield material. Furthermore, the alkali metal cell 149 and the Helmholtz coil are set inside a thermostatic bath, to keep the temperature constant. Moreover, by applying a current to the Helmholtz coil, a predetermined static magnetic field is applied onto the alkali metal cell 140. The temperature of the alkali metal cell is between 39° C. and 55° C., and is preferably kept at 42° C., at which the contrast of the CPT resonance becomes the highest value. For the cesium primary frequency standard 175, as the reference frequency source for the detectors, the cesium frequency standard 5071A (High performance tube) of Symmetricom, Inc. is employed. For the first polarizer 131 and the second polarizer 132, polarizers SPFN-30C-26 of Sigma Koki Co. Ltd., Japan, are used. A transmission axis (polarization direction) of the first polarizer 131 as the polarizer for excitation, a transmission axis (polarization direction) of the second polarizer 132 as the polarizer for detection, and a laser light axis are arranged as shown in FIG. 15.

Figure 16:
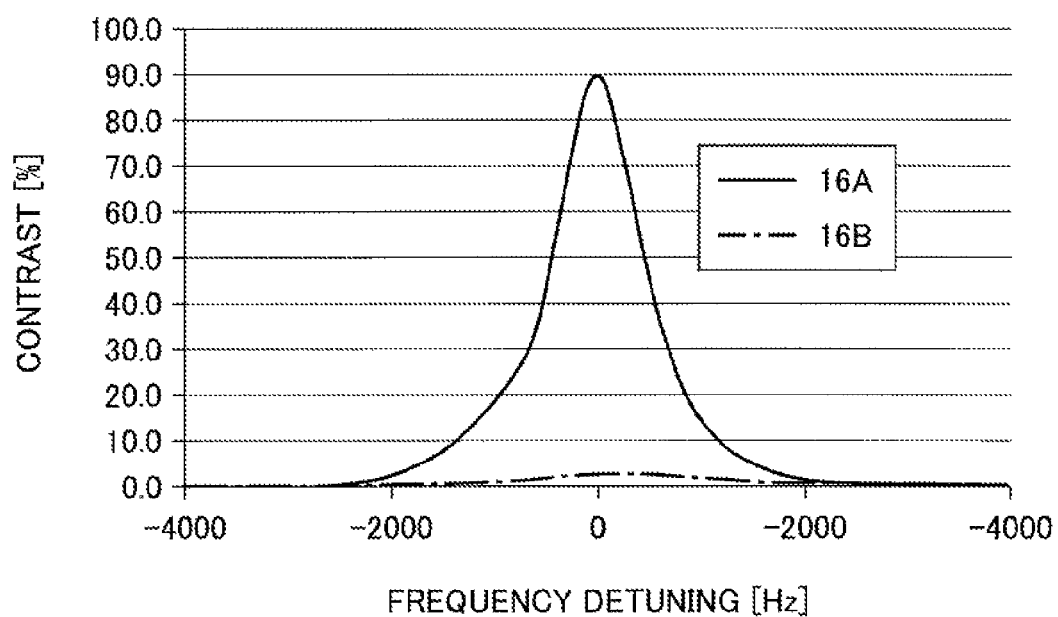
FIG. 16 is a diagram illustrating an aspect of characteristics of contrast in the CPT resonance.

Next, FIG. 16 shows a result of measurement of the CPT resonance. Solid line 16A in FIG. 16 is a result of measurement of the CPT resonance according to the present embodiment, where the first polarizer 131 and the second polarizer 132 are arranged as shown in FIG. 2. Dot-dashed line 16B in FIG. 16 is a result of measurement of the CPT resonance where the first polarizer 131 is arranged but the second polarizer 132 is replaced by a dark filter.

In configuration for the measurement to obtain the result 16A, the static magnetic field of the density of magnetic flux of 94 µT is applied to the alkali metal cell 140. In this configuration, the line width (FWHM) of the CPT resonance and the contrast are found to be 1.15 kHz and 90.1 percent, respectively. Furthermore, the positions of the first polarizer 131 and the second polarizer 132 are optimized.

On the other hand, in the configuration for the measurement to obtain the result 16B, the static magnetic field of the density of magnetic flux of 5 µT is applied to the alkali metal cell 140. In this configuration, the line width (FMHW) of the CPT resonance and the contrast are found to be 2.32 kHz and 3.3 percent, respectively.

Figure 17:
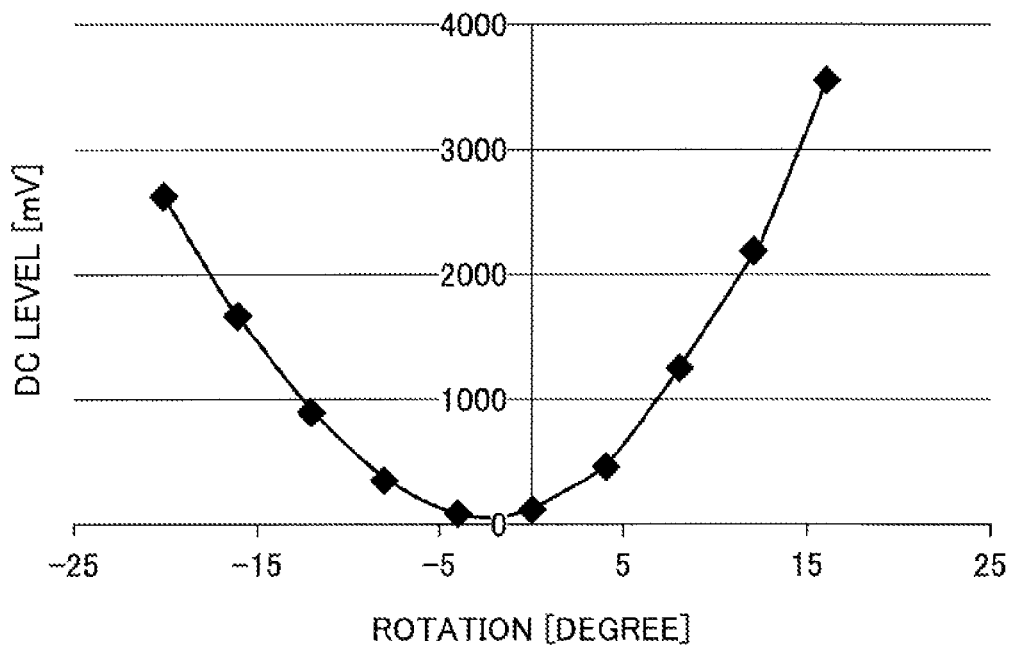
FIG. 17 is a correlation diagram illustrating an example of a correlation between a rotation angle θ and a DC (direct current) level.
Figure 18:
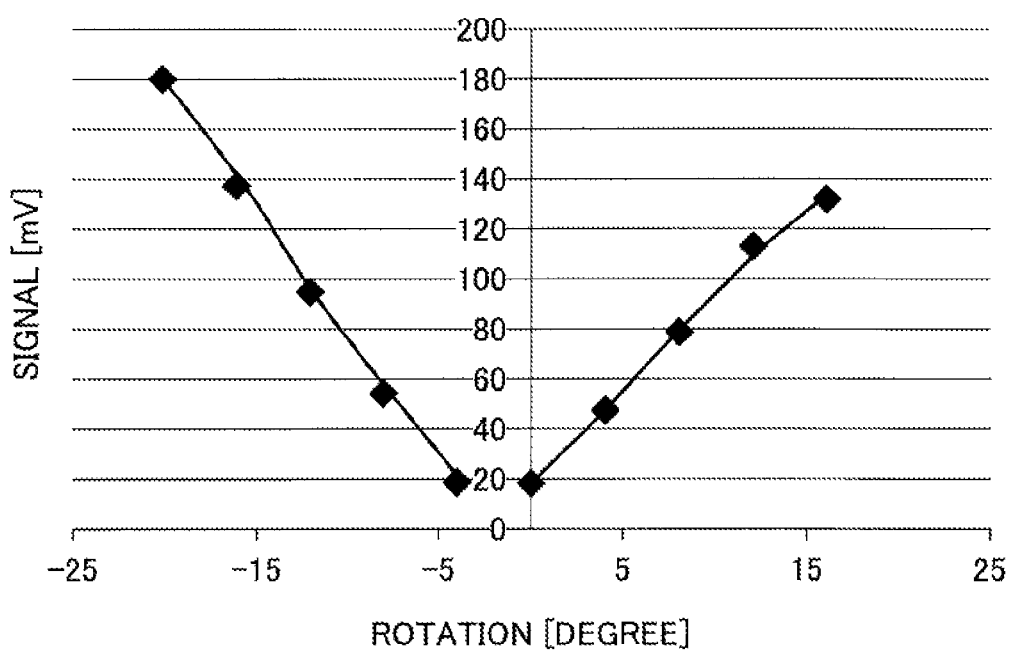
FIG. 18 is a correlation diagram illustrating an example of a correlation between the rotation angle θ and amplitude in the CPT resonance.
Figure 19:
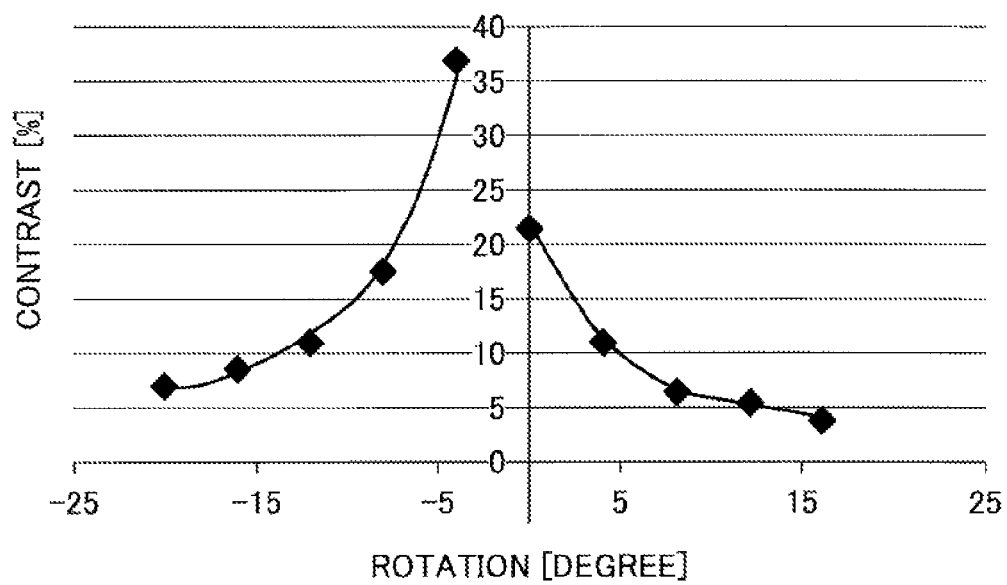
FIG. 19 is a correlation diagram illustrating an example of a correlation between the rotation angle θ and the contrast in the CPT resonance.

Next, a result of measurement for the contrast while changing the angle θ of the transmission axis of the second polarizer 132 is shown in FIGS. 17 to 19. The angle θ is defined as an angle of the transmission axis of the second polarizer 132 with respect to the direction perpendicular to the transmission axis of the first polarizer 131, as shown in FIG. 15. During the measurement, the static magnetic field of the density of magnetic flux of 30 μT is applied onto the alkali metal cell 140.

FIG. 17 illustrates a relationship between the angle θ of the second polarizer 132 and a DC (direct current) level. A component at the wavelength, which does not contribute to the CPT resonance, appears at the rotational angle of zero, i.e. θ=0. FIG. 17 shows that this component cannot be detected, and is found to be zero.

Moreover, FIG. 18 illustrates a relationship between the angle θ of the second polarizer 132 and amplitude in the CPT resonance. FIG. 18 shows that the component at the wavelength which does not contribute to the CPT resonance is found to be zero. However, the dependence of the amplitude on the angle θ is different from that of the DC current, as shown in FIG. 17. This is because the polarization angle changes according to the Faraday effect.

FIG. 19 illustrates a relationship between the angle θ of the second polarizer 132 and the contrast in the CPT resonance, derived from other results. In FIG. 19, a tendency that the contrast is enhanced where the angle θ is close to zero is found. In the present embodiment, the angle q is preferably more than −15 degrees and less than 15 degrees. Accordingly, the direction of the first polarizer 131 is only required to be non-parallel to the direction of the second polarizer 132. Furthermore, the first polarizer 131 and the second polarizer 132 are preferably arranged so that the angle between the polarization direction of the second polarizer 132 and the direction perpendicular to the polarization direction of the first polarizer 131 is less than 15 degrees.

According to the result, as shown in FIGS. 17 to 19, in the CPT resonance, the polarization direction of the component of the wavelength which contributes to the CPT resonance is found to be rotated by the Faraday effect. Furthermore, the contrast is found to be enhanced in the vicinity of the state where the angle θ is zero.

(Relationship Between Static Magnetic Field and Contrast)

Figure 20:
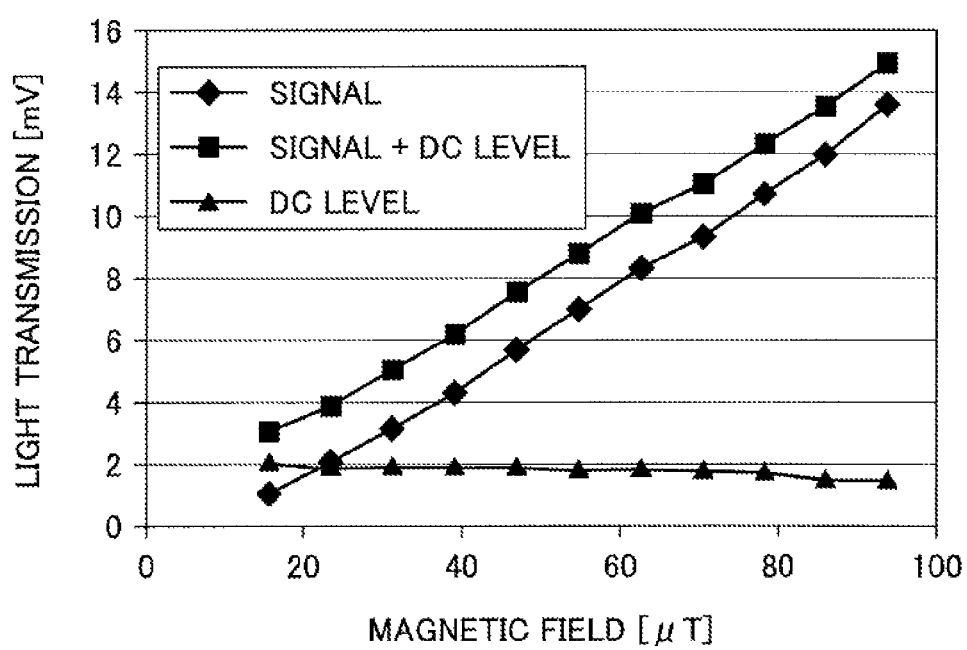
FIG. 20 is a correlation diagram illustrating an example of a correlation of a static magnetic field with the DC level and with a resonance amplitude.
Figure 21:
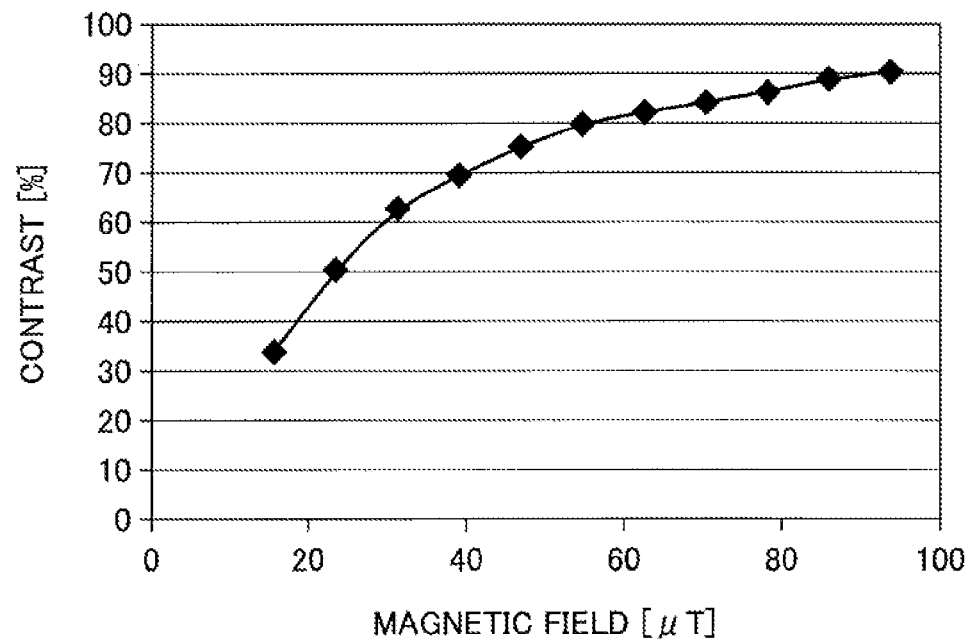
FIG. 21 is a correlation diagram illustrating an aspect of a correlation between the static magnetic field and the contrast.

Next, a result of measurement for the relationship between the static magnetic field and the contrast is shown in FIGS. 20 and 21. In this measurement, the angle θ of the second polarizer 132 is set to −3 degrees, where the contrast is the largest, as shown in FIG. 19.

FIG. 20 shows the relationship between the static magnetic field and the DC level, and the relationship between the static magnetic field and the resonance amplitude. The resonance amplitude of the CPT resonance, denoted by "signal", increases linearly with increase in the intensity of the static magnetic field. This is because the frequency difference $f_a - f_b$ between the two CPT resonances, the CPTa resonance and the CPTb resonance, shown by the dot-dashed lines and the solid lines respectively, increases, and the overlap of the Faraday effect becomes large. On the other hand, the DC level is nearly independent of the intensity of the static magnetic field and shows a constant value.

FIG. 21 shows the relationship between the static magnetic field and the contrast. The contrast is defined by formula 5 as follows:

$$\text{Contrast}[\%] = \frac{\text{Signal}}{\text{Signal} + DC \text{ level}} \times 100 \qquad \text{Formula 5}$$

The contrast is found to become large as the intensity of the static magnetic field increases. In the region where the density of magnetic flux of the magnetic field is more than 90 μT, since the DC level is considered to be approximately constant, the contrast will approach 100% as the static magnetic field increases. In the present embodiment, the density of magnetic flux B is preferably more than 16 μT.

(Relationship Between Static Magnetic Field and Line Width)

Figure 22:
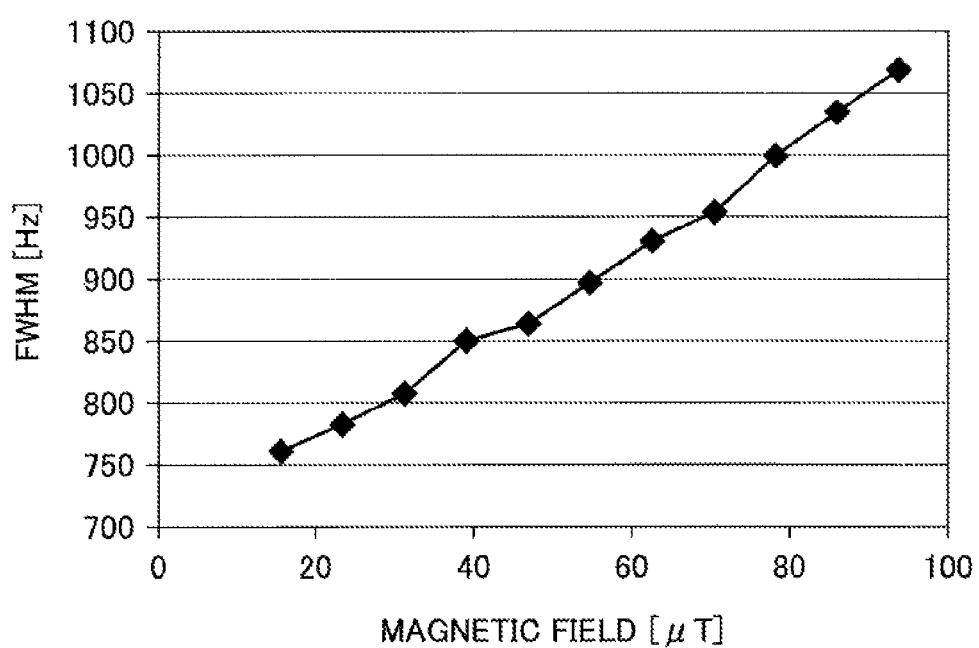
FIG. 22 is a correlation diagram illustrating an example of a correlation between the static magnetic field and a full width at half maximum (FWHM)

FIG. 22 shows a result of measurement for the relationship between the static magnetic field and the line width of the CPT resonance. In this measurement, the angle θ of the second polarizer 132 is set to −3 degrees, where the contrast is the largest, as shown in FIG. 19. As shown in FIG. 22, the line width of the CPT resonance increases approximately linearly with increase in the intensity of the static magnetic field. This is because the frequency difference $f_a - f_b$ between the two CPT resonances, the CPTa resonance and the CPTb resonance, shown by the dot-dashed lines and the solid lines, respectively, increases, and the line width broadens.

(Relationship Between Static Magnetic Field and Figure of Merit)

Figure 23:
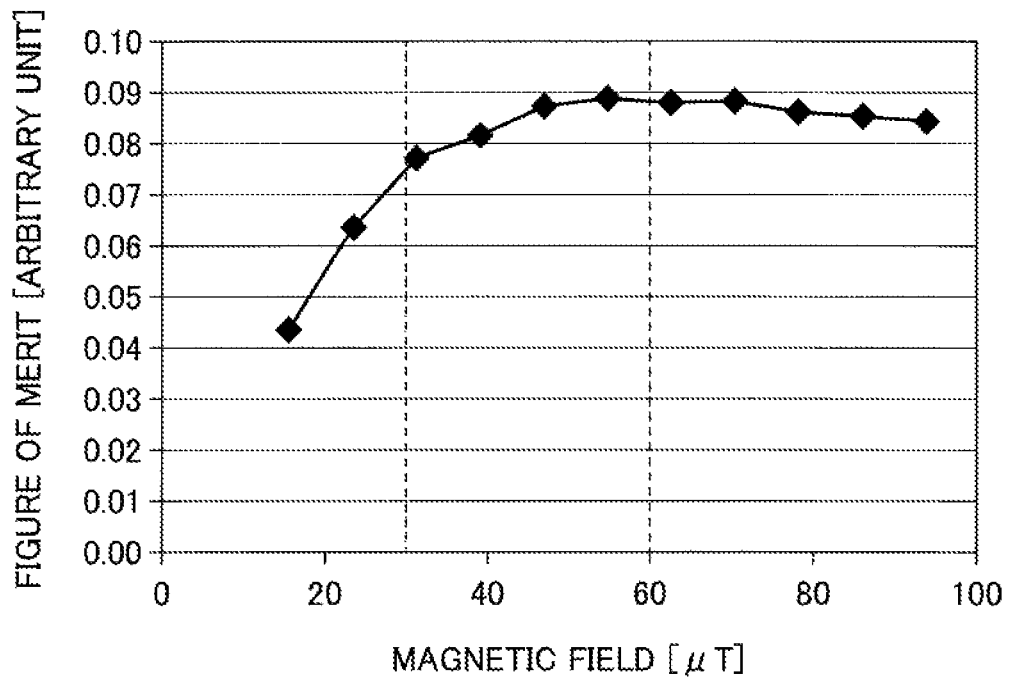
FIG. 23 is a correlation diagram illustrating an example of a correlation between the static magnetic field and a figure of merit (FOM)

FIG. 23 shows a result of measurement for the relationship between the static magnetic field and the figure of merit (FOM). The figure of merit is defined as the contrast divided by the FWHM, as shown in R. Lutwak, et al., "The Chip-Scale Atomic Clock, Recent Development Progress", Proceedings of the 35th Annual Precise Time and Time Interval (PTTI) Systems and Applications Meeting, Dec. 2-4, 2003, San Diego, Calif., USA, pp. 467-478. In the region where the density of magnetic flux B is less than 30 the figure of merit rises steeply. In the region where B is greater than 30 μT and less than 60 μT, the figure of merit gradually increases. However, in the region where B is greater than 60 μT, the figure of merit gradually decreases. This is because in the region where the B is less than 30 μT, especially the rise of the contrast is dominant in the increase in the figure of merit, but in the region where B is greater than 60 μT, the broadening of the FWHM is dominant in the decrease in the figure of merit. Accordingly, in the present embodiment, the density of magnetic flux B is preferably within the region where B is greater than 30 μT and less than 60 μT and the figure of merit has the maximum.

In the present embodiment, as describes above, the alkali metal cell 140 is formed of a glass cell. The present embodiment is not limited to this. The alkali metal cell 140 may be a MEMS (Micro Electro Mechanical Systems) gas cell, which is formed by forming a through hole in a substrate, such as a silicon (Si) substrate, and by attaching glass substrates on both sides of the substrate. By using the above gas cell, the atomic oscillator can be miniaturized and the cost can be lowered.

In the present embodiment, cesium (Cs) is used for the alkali metal encapsulated in the alkali metal cell 140. The present embodiment is not limited to this. Other alkali metals, such as rubidium (Rd), sodium (Na) or potassium (K) may be used instead of cesium.

Moreover, the first polarizer 131 or the second polarizer 132 may be attached on the face of the alkali metal cell 140, through which the laser light passes. Both the first polarized 131 and the second polarized 132 may be attached on the faces of the alkali metal cell 140. The alkali metal cell may be heated by the first polarizer 131 or the second polarizer 132. The laser light, which does not pass through the first polarizer 131 or the second polarizer 132 is converted into heat. By heating the face of the alkali metal cell 140 to which the first polarizer 131 or the second polarizer 132 is attached, adhesion of the cesium atoms to the face of the alkali metal cell 140 can be prevented, and thus the light quantity can be maintained.

Second Embodiment

Next, the second embodiment of the present invention will be described. A magnetic sensor according to the present embodiment detects a magnetic field by using the characteristics where the line width of the CPT resonance linearly depends on the static magnetic field and the amplitude of the CPT resonance linearly depends on the static magnetic field.

The CPT type magnetic sensor in the related art measures a frequency difference between a magnetic sublevel, which is highly sensitive to a magnetic field, and another magnetic sublevel, which is insensitive to the magnetic field, and estimates the magnetic field, as shown in P. D. D. Schwindt, "Chip-scale atomic magnetometer", Applied Physics Letters, 85, 6409 (2004). The frequency difference between the magnetic sublevels becomes large as the magnetic field increases. However, in the case of applying a strong magnetic field, sweeping a wide range of the magnetic field is required, and accuracy and precision of the measurement may be degraded.

Moreover, in the region of high density magnetic flux (greater than 50 mT), the dependency of the frequency difference between the magnetic sublevel which is the most sensitive to the magnetic field and another magnetic sublevel which is the least sensitive to the magnetic field, on the magnetic field is known to be non-linear. In order to acquire an accurate value of the density of magnetic flux, the frequency difference is required to be converted to the density of magnetic flux taking account of the non-linearity.

Figure 24:
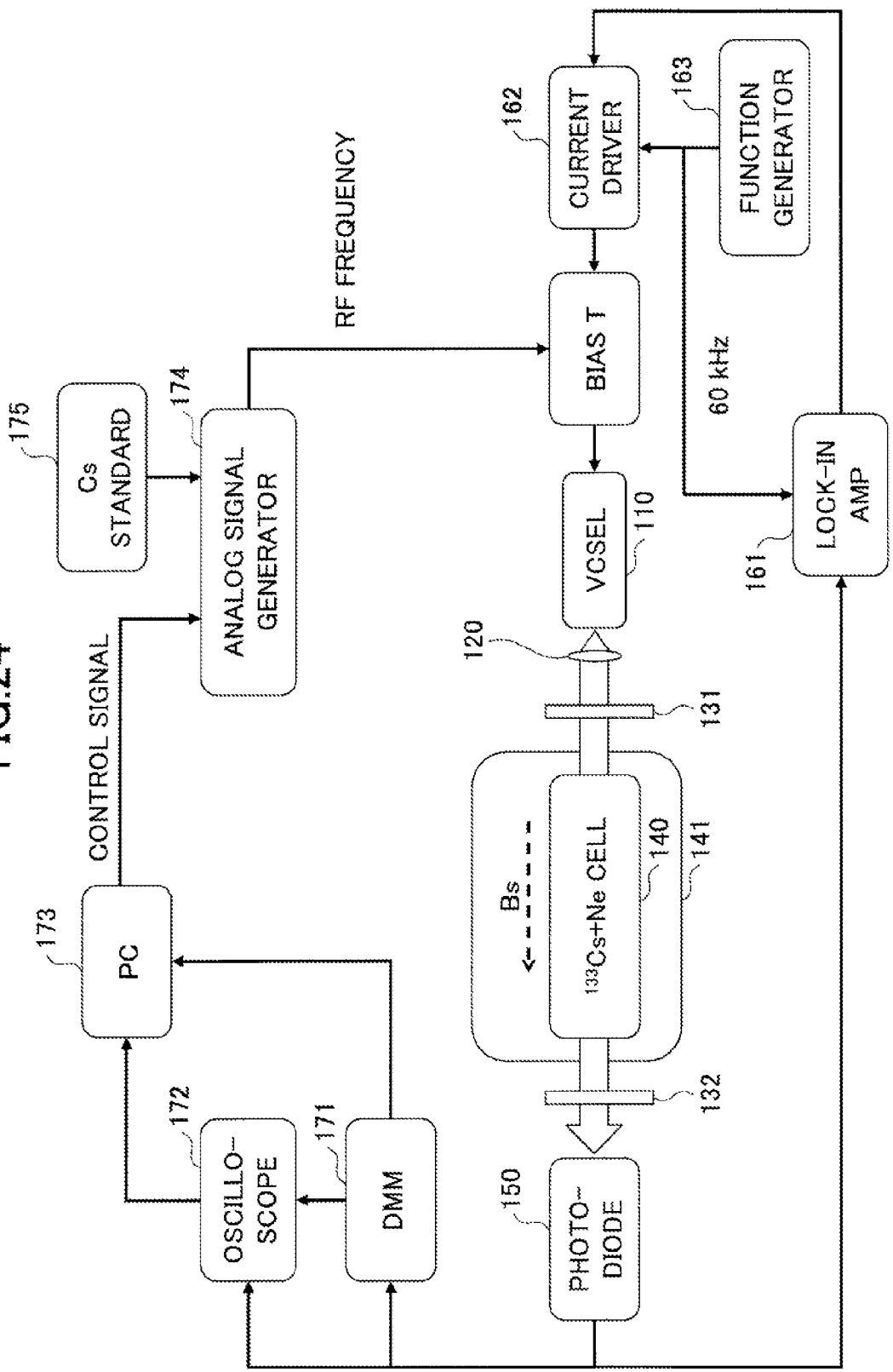
FIG. 24 is a configuration diagram illustrating an example of a magnetic sensor according to a second embodiment.

FIG. 24 shows a diagram illustrating an example of a configuration of the magnetic sensor according to the present embodiment. The magnetic sensor includes a laser light source 110, an alkali metal cell 140 and a light detector 150, as in the first embodiment. A first polarizer 131 and a second polarizer 132 are arranged between the laser light source 110 and the alkali metal cell 140 and between the alkali metal cell 140 and the light detector 150, respectively. The magnetic sensor according to the present embodiment detects a value of the magnetic field in the alkali metal cell 140 as a density of magnetic flux Bs. Different from the atomic oscillator according to the first embodiment, as shown in FIG. 2, a static magnetic field, by the Helmholtz coil or the like, is not applied on the alkali metal cell 140 according to the present embodiment.

The magnetic sensor according to the present embodiment detects the value of the density of magnetic flux from the full width at half maximum of the CPT resonance, and thus solves the problem of the related art. That is, the magnetic sensor according to the present embodiment, which measures a full width at the half maximum (FWHM) or an amplitude of one CPT resonance, does not sweep a wide range of frequencies, and can acquire a magnetic field simply and accurately. Moreover, since the FWHM and the amplitude are in principle proportional to the magnetic field, in converting to the magnetic field the non-linearity such as the magnetic sublevels in the related art need not be taken into account. Furthermore, the signal-to-noise (S/N) ratio can be improved.

Next the magnetic sensor according to the present embodiment will be explained in detail.

(Magnetic Sensor Using Property of Linear Relationship Between Resonance Line Width (FWHM) and Density of Magnetic Flux)

FIG. 3 is an energy level diagram of the cesium 133 $D_1$ line data, and illustrates two CPT resonances excited by linear polarization. That is, according to the linear polarization, the CPT resonance CPTa, shown by the dot-dashed lines and the CPT resonance CPTb, shown by the solid lines are excited. A signal, including the two CPT resonances, which overlap each other, is observed. Contributions from CPT resonances by the other levels are separated in the measurement by applying a static magnetic field onto the alkali metal cell 140, since a shift in frequency by the static magnetic field is large for the other magnetic sublevels.

The frequencies $f_a$ and $f_b$, for the density of magnetic flux B, are expressed by formula 6.

$$f_{a,b} = \pm \frac{2g_I g_I \mu_B}{h} B + \frac{f_{hfs}}{2} \cdot \left(1 \pm \frac{(g_J - g_I)\mu_B B}{2hf_{hfs}} + \frac{(g_J - g_I)^2 \mu_B^2 B^2}{h^2 f_{hfs}^2}\right)^{1/2} + \frac{f_{hfs}}{2} \cdot \left(1 \mp \frac{(g_J - g_I)\mu_B B}{2hf_{hfs}} + \frac{(g_J - g_I)^2 \mu_B^2 B^2}{h^2 f_{hfs}^2}\right)^{1/2}$$

Formula 6

In formula 6, $f_{hfs}$ is the hyperfine splitting frequency, as shown in FIG. 3, and $g_J$ is the Landé g-factor.

The frequency difference between the two levels is derived from the expression in formula 6. The frequency difference $f_a - f_b$ is expressed by formula 7, which is obtained in the approximation up to the order of $(g_J - g_I)^2$.

$$f_a - f_b = \frac{4 g_I \mu_B}{h} B$$

Formula 7

The frequency difference is proportional to the density of magnetic flux B, and independent of the frequency $f_{hfs}$.

The observed full width at half maximum (FWHM) of the CPT resonance is proportional to the density of magnetic flux B. Accordingly, the density of magnetic flux B can be simply obtained from the FWHM of the CPT resonance. Moreover, the density of magnetic flux B and the FWHM have a linear relationship, as shown by FIG. 22. Accordingly, if the range of the magnetic field to be measured is wide, the density of magnetic flux B can be measured accurately.

Figure 25:
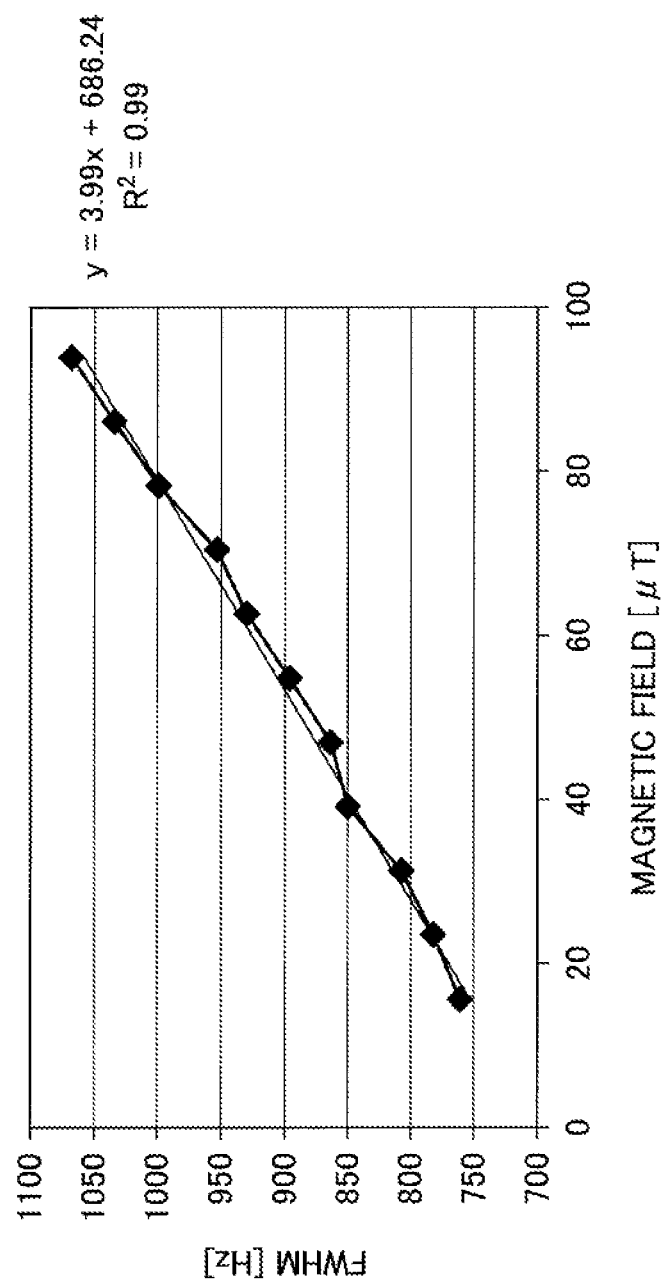
FIG. 25 is a correlation diagram illustrating another aspect of the correlation between the static magnetic field and the contrast.

FIG. 25 shows a result of measurement for the relationship between the density of magnetic flux B and the FWHM. According to the result shown in FIG. 25, an amount of change in the frequency with respect to the density of magnetic flux is 3.99 Hz/T, and a correlation factor is 0.9936, which shows a quite high linearity between the density of magnetic flux and the FWHM. The magnetic sensor according to the present embodiment measures the magnetic field with high precision.

(Magnetic Sensor Using Property of Linear Relationship Between Resonance Amplitude and Magnetic Field)

Moreover, the resonance amplitude can be used for the magnetic sensor in a certain range of the magnetic field, as the resonance line width (FWHM). In order to use the resonance amplitude for the magnetic sensor, the following two restrictions are required to be taken into consideration.

The process of converting measured data into the magnetic field in the present embodiment uses the principle of the Zeeman effect. The resonance amplitude is one of the parameters which may vary indirectly, i.e. the resonance amplitude may be affected by the factors other than the magnetic field, such as the intensity of light or the temperature of the gas cell. Accordingly, influences from these factors need be taken into account in measuring the density of magnetic flux.

Furthermore, in the case of the strong magnetic field, the resonance amplitude does not depend on the density of magnetic flux linearly. The result of measurement shows that in the extremely strong magnetic field, the resonance amplitude becomes saturated. The linearity appears where the density of magnetic flux is outside the region of the strong magnetic field. Although the relationship between the density of magnetic flux and the resonance amplitude does not have the linearity in the strong magnetic field, the resonance amplitude can be used for detecting the density of magnetic flux in the weak magnetic field.

The resonance amplitude can be used for the magnetic sensor, taking the above restrictions into consideration. Moreover, the resonance amplitude and the FWHM can be used in combination for the measurement of the magnetic field.

Third Embodiment

Figure 26:
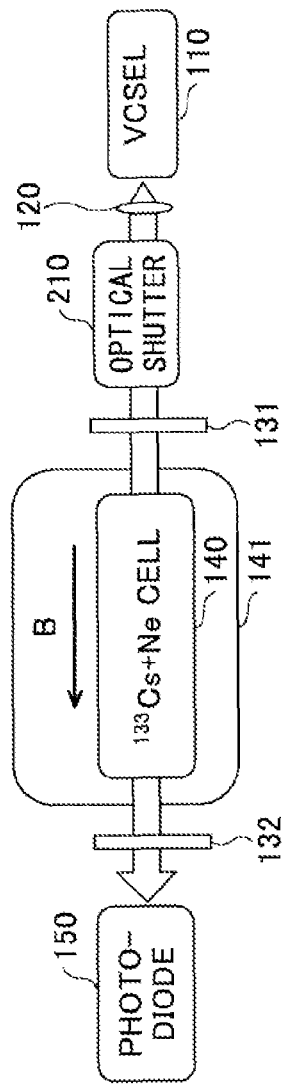
FIG. 26 is an explanatory diagram illustrating an aspect of the atomic oscillator according to the third embodiment.

Next, the third embodiment of the present invention will be described in the following. As shown in FIG. 26, in the atomic oscillator an optical intensity modulator 210 may be used. FIG. 26 shows a configuration in which the optical intensity modulator 210 is provided between the collimation lens 120 and the first polarizer 131.

The optical intensity modulator 210 is an optical element that modulates an intensity of the laser light injected into the alkali metal cell 140. Specifically, as the optical intensity modulator 210, a light chopper, a MEMS (Micro Electro Mechanical Systems) shutter, an acousto-optic modulator, a liquid crystal, or the like may be used.

Figure 27:
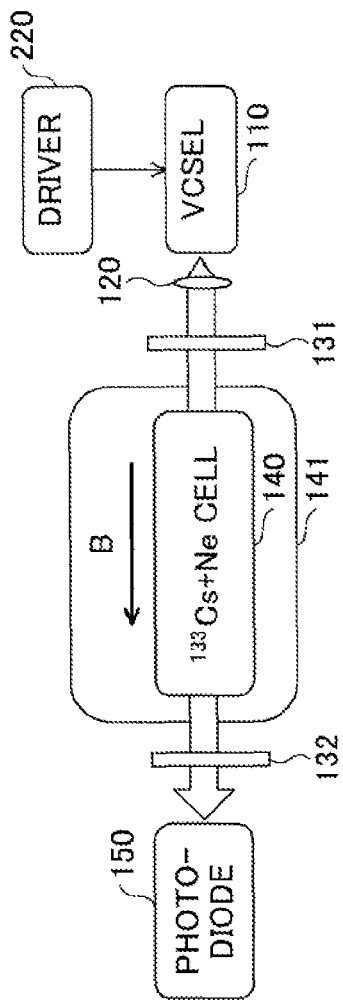
FIG. 27 is an explanatory diagram illustrating another aspect of the atomic oscillator according to the third embodiment.

Next, FIG. 27 shows an atomic oscillator which directly modulates the optical intensity and does not require the optical intensity modulator 210. In a pulse excitation, in order to modulate the optical intensity of the laser light injected into the alkali metal cell 140, a power input to the laser light source 110 is applied to a pulse by a light source driver 220, and a generated optical pulse is injected into the alkali metal cell 140.

A polarizer method uses the Faraday effect in the CPT. The Faraday effect in the CPT arises from an overlap of two resonances excited by the linear polarization excitation (Δm=2). Accordingly, the magnetic field to be applied is required to be relatively strong in order to obtain a large overlap of the resonances. However, the application of high density magnetic flux enlarges the second order Zeeman shift, and may cause a degradation of long term stability of frequency. That is, in the polarizer method, the density of magnetic flux applied to the gas cell is preferably low.

In the present embodiment, in order to reduce the second order Zeeman effect, the pulse excitation and the polarizer method are combined. By the pulse excitation, a power broadening of the CPT resonance is suppressed, a resonance with narrower line width is obtained, and the strength of the magnetic field to be applied can be lowered compared with the case in the continuous excitation.

A factor that determines the line width of the CPT resonance in the continuous excitation is a natural broadening, the intensity of the injected laser light, a collision broadening depending on a pressure of buffer gas, or uniformity of the magnetic field. Especially, the line width of the CPT resonance in the continuous excitation is proportional to the intensity of the injected laser light. The phenomenon that the line width of the CPT resonance is broadened in proportion to the laser intensity is called a power broadening effect, which is a dominant factor to broaden the line width of the CPT resonance. On the other hand, the line width of the CPT resonance obtained by the pulse excitation is known to be independent of the laser intensity. The obtained line width depends on the time of the pulse-off (time of free evolution), which is given by Formula 8 as follows.

$$FWHM = \frac{1}{2T} \qquad \text{Formula 8}$$

Accordingly, in the case of injecting laser with high intensity, the line width in the pulse excitation is narrower than that in the continuous excitation.

Next, the principle of the atomic oscillator according to the present embodiment will be explained in the following. An absorption spectrum of the CPT resonance in the pulse excitation can be approximated with a cosine function. Then, a dispersion spectrum, i.e. the polarization rotation, becomes a sine function according to the Kramers-Kronig relations. When the polarization rotations regarding the resonances "a" and "b" are denoted $\theta_a$ and $\theta_b$), respectively, the polarization rotation by the CPT is an overlap of them, which is given by Formula 9 as follows.

$$\theta = \theta_a + \theta_b \qquad \text{Formula 9}$$

Taking account of the following three restrictions, that (1) the polarization rotation is a sine function, (2) signs of the two polarization rotations $\theta_a$ and $\theta_b$ are different from each other according to a symmetry of the resonance, and (3) frequencies of the two resonances are shifted to different directions from each other according to the Zeeman shift, the polarization rotation of Formula 9 is rewritten as Formula 10.

$$\begin{aligned}\theta &= \theta_a + \theta_b \\ &= \theta_0 \sin\left(2\pi\left(\frac{f + f_B/2}{2FWHM}\right)\right) - \theta_0 \sin\left(2\pi\left(\frac{f - f_B/2}{2FWHM}\right)\right) \\ &= 2\theta_0 \cos\left(2\pi\frac{f}{2FWHM}\right)\sin\left(\pi\frac{f_B}{2FWHM}\right)\end{aligned} \qquad \text{Formula 10}$$

In Formula 10, $\theta_o$ is a maximum rotational angle of $\theta_a$ and $\theta_b$, $f_B$ is a pulse recurrence frequency, which is a difference between the frequencies $f_a$ and $f_b$, and f is a resonance frequency, i.e. an average of $f_a$ and $f_b$. From Formula 10, the condition for the density of magnetic flux that maximizes the rotational angle θ is given by Formula 11, as follows.

$$\sin\left(\pi \frac{f_B}{2FWHM}\right) = 1, \quad \text{Formula 11}$$

that is, $\pi f_B/2FWHM = \pi/2$, and finally $f_B/FWHM = 1$ is obtained.

Combining the relations given by Formulas 8 and 11, and the relation between the frequency fB and the density of magnetic flux, which is given by Formula 12 as follows, $$f_a - f_b = \frac{4g_I\mu_B}{h}B, \quad \text{Formula 12}$$

the density of magnetic flux is obtained as Formula 13.

$$B = \frac{h}{4g_I\mu_B}FWHM = \frac{h}{4g_I\mu_B}\frac{1}{2T} \quad \text{Formula 13}$$

As shown in Formula 13, the narrower the line width is, the density of magnetic flux, which maximizes the rotational angle, becomes lower. For example, in the case of cesium, Cs, the frequency difference $f_B$ is given by Formula 14.

$$f_B = \frac{4g_I\mu_B}{h}B = 22.3B[\text{Hz}/\mu\text{T}] \quad \text{Formula 14}$$

According to the above relation, when the pulse recurrence frequency $f_B$ is 1000 Hz (i.e. a pulse cycle length T is 0.5 ms), the density of magnetic flux B that maximizes the rotational angle is estimated to be 44 µT. For the pulse recurrence frequencies of 800 Hz (T is 0.625 ms), 600 Hz (T is 0.833 ms) and 400 Hz (T is 1.250 ms), the densities of magnetic flux are estimated to be 36 µT, 27 µT and 18 µT, respectively. The results of the above estimations are shown in Table 1.

TABLE 1

| Pulse recurrence frequency [Hz] | Pulse cycle length (T) [µs] | Estimated density of magnetic flux [µT] |
|---|---|---|
| 1000 | 500 | 44 |
| 800 | 625 | 36 |
| 600 | 833 | 27 |
| 400 | 1250 | 18 |

Figure 28:
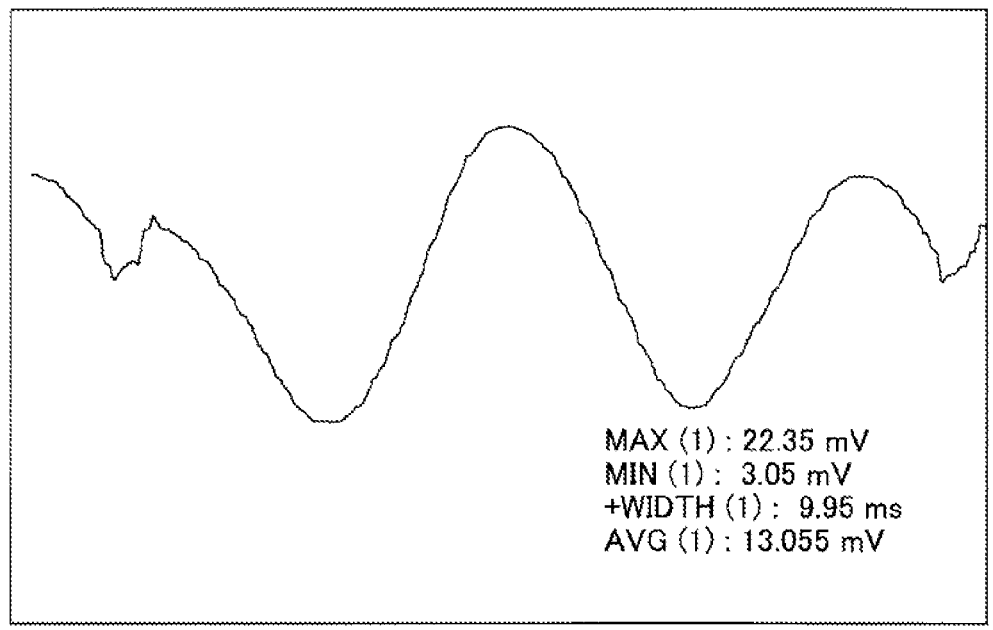
FIG. 28 is an explanatory diagram illustrating the CPT resonance spectrum in the case where a pulse excitation and a polarizer method are combined.

FIG. 28 illustrates a spectrum of the CPT resonance in the case where the pulse excitation and the polarizer method are combined. The pulse recurrence frequency is set to 400 Hz, and the applied density of magnetic flux is 16 µT. Though an obtained amplitude (signal) of the resonance is 22.35 mV, the DC level is 3.05 mV, which is quite low. The contrast is 86%. Moreover, the line width (FWHM) is 170 Hz for the resonance frequency of 4.6 GHz. Since the line width estimated from a pulse recurrence cycle length is 200 Hz, the obtained line width of the CPT resonance is smaller than the theoretical value, where a difference between them is about 20%.

Figure 29:
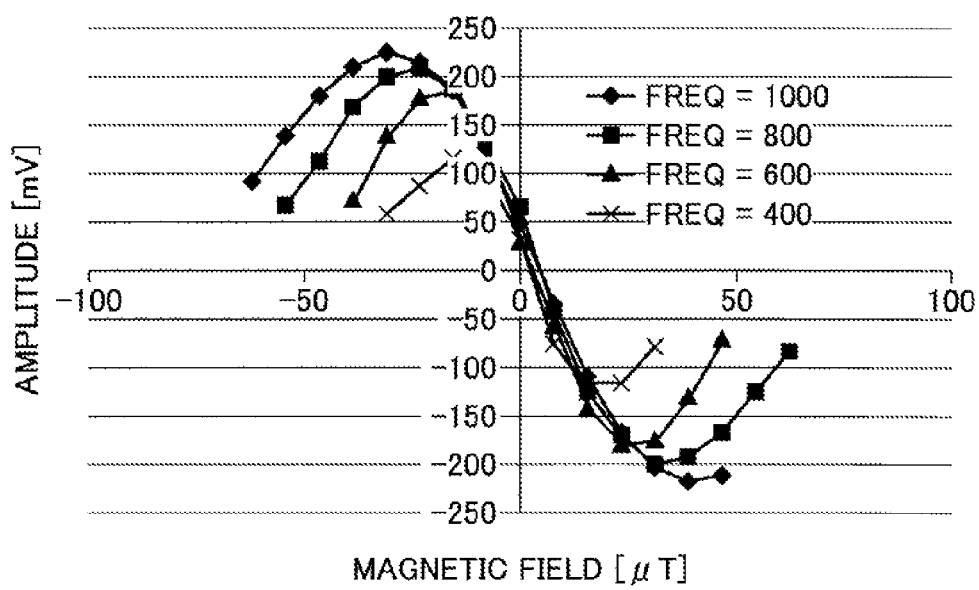
FIG. 29 is a correlation diagram illustrating an example of a correlation between a change in the magnetic field and the resonance amplitude.

FIG. 29 illustrates a resonance amplitude in the case where the pulse recurrence frequency is changed for a variety of magnetic fields. Each of the resonance amplitudes can be found to have a maximum density of magnetic flux. The density of magnetic flux is measured at 7.7 µT intervals.

In the case of the continuous excitation, the density of magnetic flux that maximizes the resonance amplitude is 93 µT. On the other hand, in the pulse excitation, according to the narrowing of the line width of the resonance, the density of magnetic flux becomes 31 µT, when the pulse recurrence frequency is 1000 Hz, and the density of magnetic flux becomes 16 µT, when the pulse recurrence frequency is 400 Hz. As described above, the density of magnetic flux necessary for the pulse excitation is sufficiently low compared with the density of magnetic flux required for the continuous excitation. The results of the measurements are shown in Table 2.

TABLE 2

| Pulse recurrence frequency [Hz] | Pulse cycle length (T) [µs] | Estimated density of magnetic flux [µT] (theoretical value) | Measured density of magnetic flux [µT] (experimental value) |
|---|---|---|---|
| 1000 | 500 | 44 | 31 |
| 800 | 625 | 36 | 23 |
| 600 | 833 | 27 | 16 |
| 400 | 1250 | 18 | 16 |

FIG. 2 shows that as the pulse recurrence frequency becomes smaller, i.e. the pulse cycle length becomes longer, the maximum density of magnetic flux tends to become lower. Moreover, the experimental value is smaller than the theoretical value by about 20%. Since the obtained line width is narrower than the theoretical value by about 20%, the difference between the experimental value and the theoretical value in the density of magnetic flux is considered to be significant.

Fourth Embodiment

Next, the fourth embodiment of the present invention will be described. Though the present embodiment relates to a magnetic sensor, a part of the characteristic configuration is the same as that in the third embodiment.

The polarizer method utilizes the Faraday effect in the CPT. The Faraday effect in the CPT arises from the overlap of the two resonances (Δm=2) excited by the linear polarization excitation. The magnetic sensor by the polarizer method according to the present embodiment estimates the applied density of magnetic flux, based on the Zeeman shift between two resonances, from a line width or an amplitude of the obtained resonance.

In general, a magnetic sensor is required to have a high resolution. Moreover, the resolution depends on sensitivity to the magnetic field. Accordingly, in order to enhance the resolution for density of magnetic flux, the sensitivity of the resonance characteristic to the density of magnetic flux is required to be improved.

For the improvement of the sensitivity of the resonance characteristic to the density of magnetic flux, the pulse excitation is combined with the polarizer method in the present embodiment. The pulse excitation suppresses the power broadening of the CPT resonance, a resonance with narrower line width is obtained, and the change in the resonance amplitude for the density of magnetic flux can be enhanced.

A factor which determines the line width of the CPT resonance in the continuous excitation is a natural broadening, the intensity of the injected laser light, a collision broadening depending on a pressure of buffer gas, or uniformity of the magnetic field. Especially, the line width of the CPT resonance in the continuous excitation is proportional to the intensity of the injected laser light. The phenomenon in which the line width of the CPT resonance is broadened in proportion to the laser intensity is called a power broadening effect, which is a dominant factor to broaden the line width of the CPT resonance. On the other hand, the line width of the CPT resonance obtained by the pulse excitation is known to be independent of the laser intensity. The obtained line width depends on the time of the pulse-off (time of free evolution), which is given by Formula 15 as follows.

$$FWHM = \frac{1}{2T} \qquad \text{Formula 15}$$

Accordingly, in the case of injecting laser light with high intensity, the line width in the pulse excitation is narrower than that in the continuous excitation.

Next, the sensitivity of the polarization rotation ($\partial\theta/\partial B$) to a magnetic field will be calculated, and the characteristics of the resonance in the continuous excitation and in the pulse excitation are compared. Specifically, results of calculation are compared, and it will be confirmed whether the sensitivity of the polarization rotation ($\partial\theta/\partial B$) to the magnetic field in the pulse excitation is better than that in the continuous excitation.

(Continuous Excitation)

An absorption spectrum of CPT resonance in the case of the continuous excitation can be approximated by a Lorenz function. According to the Kramers-Kronig relations, the dispersion spectrum, i.e. the spectrum of the polarization rotation, is obtained by a derivative of the Lorenz function. When polarization rotations regarding the resonance "a" and "b" are denoted $\theta_a$ and $\theta_b$, respectively, the polarization rotation by the CPT is obtained by the overlap, and given by Formula 16 as follows.

$$\theta = \theta_a + \theta_b \qquad \text{Formula 16}$$

Taking account of the following three restrictions, that (1) the polarization rotation is a derivative of the Lorenz function, (2) signs of the two polarization rotations $\theta_a$ and $\theta_b$ are different from each other according to a symmetry of the resonance, and (3) frequencies of the two resonances are shifted to different directions from each other according to the Zeeman shift, the polarization rotation of Formula 16 is rewritten as Formula 17.

$$\theta = \theta_0 \left( \frac{\gamma(\delta - f_B/2)}{\gamma^2 + (\delta - f_B/2)^2} - \frac{\gamma(\delta + f_B/2)}{\gamma^2 + (\delta + f_B/2)^2} \right) \qquad \text{Formula 17}$$

$$= -\theta_0 \frac{4\gamma f_B(-4\delta^2 + 4\gamma^2 f_B^2)}{(4\gamma^2 + 4\delta^2 + f_B^2)^2 - 16\delta^2 f_B^2}$$

In Formula 17, $\theta_0$ is a maximum rotational angle of $\theta_a$ and $\theta_b$. Moreover, from the symmetry, we assume that $\theta_a = \theta_b$. For simplicity, the frequency detuning $\delta$ and the Zeeman shift amount $f_B$ are normalized by the half width at half maximum $\gamma$. We denote the normalized frequency detuning and the normalized Zeeman shift amount by d ($=\delta/\gamma$) and b ($=f_B/2\gamma$), respectively, and Formula 17 is rewritten as Formula 18.

$$\theta = -\theta_0 \frac{2b(1 + b^2 - d^2)}{(1 + b^2 + d^2)^2 - 4b^2 d^2} \qquad \text{Formula 18}$$

Moreover, the rotational angle of polarization becomes maximum where the frequency detuning is zero, i.e. d=0. By substituting the value of "d" (=0) into Formula 18, we obtain Formula 19.

$$\theta = -\theta_0 \frac{2b}{1 + b^2} \qquad \text{Formula 19}$$

Figure 30:
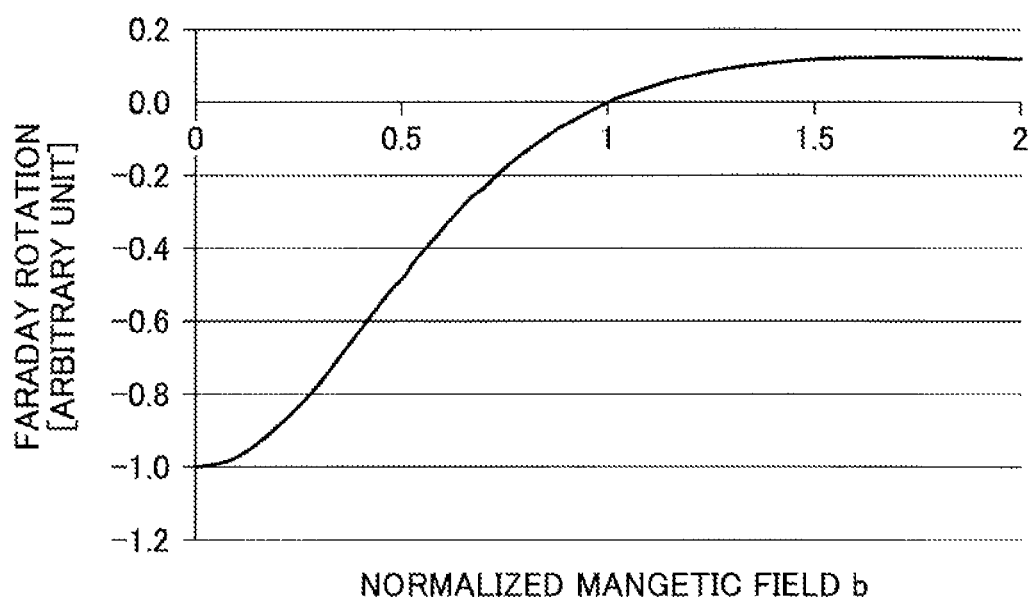
FIG. 30 is a correlation diagram illustrating an example of a correlation between a magnetic field in the continuous excitation and the Faraday rotational angle.

Moreover, the variable "b", the Zeeman shift amount, is a function of the density of magnetic flux B. If the variable "b" is proportional to the density of magnetic flux B, "b" can be expressed by b=kB, where "k" is a proportional constant. The sensitivity of the polarization rotation ($\partial\theta/\partial B$) to a magnetic field is expressed by Formula 20. FIG. 30 illustrates the Faraday rotation angle expressed by Formula 20 in terms of b.

$$\frac{\partial \theta}{\partial B} = \frac{\partial \theta}{\partial b} \cdot \frac{\partial b}{\partial B} \qquad \text{Formula 20}$$

$$= \theta_0 \frac{b^2 - 1}{(1 + b^2)^2} \cdot k$$

The sensitivity becomes a maximum at B=0, which is expressed by Formula 21.

$$\left| \frac{\partial \theta}{\partial B} \right|_{max} = \theta_0 k \qquad \text{Formula 21}$$

From Formula 4 in the first embodiment, we obtain the expression for "b", which is shown in Formula 22.

$$b = kB = \frac{f_B}{2\gamma} = \frac{4g_I \mu_B B}{h} \cdot \frac{1}{2\gamma} \qquad \text{Formula 22}$$

From Formula 22, the expression for "k" is obtained as Formula 23.

$$k = \frac{2g_I \mu_B}{\gamma h} \qquad \text{Formula 23}$$

The maximum value of the sensitivity of the polarization rotation ($\partial\theta/\partial B$) to the magnetic field is given by Formula 24.

$$\left| \frac{\partial \theta}{\partial B} \right|_{max} = \theta_0 \frac{2g_I \mu_B}{\gamma h} \qquad \text{Formula 24}$$

As can be seen from Formula 24, the smaller the half width at half maximum of the resonance is, the higher the sensitivity is.

(Pulse Excitation)

An absorption spectrum of CPT resonance in the case of the pulse excitation can be approximated by a cosine function. According to the Kramers-Kronig relations, the dispersion spectrum, i.e. the spectrum of the polarization rotation, is a sine function. When polarization rotations regarding the resonance "a" and "b" are denoted $\theta_a$ and $\theta_b$, respectively, the polarization rotation by the CPT is obtained by an overlap of them, and given by Formula 25 as follows.

$$\theta = \theta_a + \theta_b \quad \text{Formula 25}$$

Taking account of the following three restrictions, that (1) the polarization rotation is a sine function, (2) signs of the two polarization rotations $\theta_a$ and $\theta_b$ are different from each other according to a symmetry of the resonance, and (3) frequencies of the two resonances are shifted to different directions from each other according to the Zeeman shift, the polarization rotation of Formula 25 is rewritten as Formula 26.

$$\begin{aligned} \theta &= \theta_a + \theta_b \\ &= \theta_0 + \sin\left(2\pi\left(\frac{\delta + f_B/2}{4\gamma}\right)\right) - \theta_0 \sin\left(2\pi\left(\frac{\delta - f_B/2}{4\gamma}\right)\right) \\ &= 2\theta_0 \cos\left(2\pi \frac{\delta}{4\gamma}\right) \sin\left(\pi \frac{f_B}{4\gamma}\right) \end{aligned} \quad \text{Formula 26}$$

In Formula 26, $\theta_0$ is a maximum rotational angle of $\theta_a$ and $\theta_b$. Moreover, from the symmetry, we assume that $\theta_a = \theta_b$. For simplicity, the frequency detuning $\delta$ and the Zeeman shift amount $f_B$ are normalized by the half width at half maximum $\gamma$. We denote the normalized frequency detuning and the normalized Zeeman shift amount by d ($=\delta/\gamma$) and b ($=f_B/2\gamma$), respectively, and Formula 26 is rewritten as Formula 27.

$$\begin{aligned} \theta &= 2\theta_0 \cos\left(2\pi \frac{\delta}{4\gamma}\right) \sin\left(\pi \frac{f_B}{4\gamma}\right) \\ &= 2\theta_0 \cos\left(\frac{\pi}{2}d\right) \sin\left(\frac{\pi}{2}b\right) \end{aligned} \quad \text{Formula 27}$$

Next, the sensitivity of the polarization rotation ($\partial\theta/\partial B$) will be derived. From the expression shown in Formula 27, the sensitivity ($\partial\theta/\partial B$) is expressed by Formula 28.

$$\begin{aligned} \frac{\partial \theta}{\partial B} &= \frac{\partial}{\partial B}\left(2\theta_0 \cos\left(\frac{\pi}{2}d\right)\sin\left(\frac{\pi}{2}b\right)\right) \\ &= \theta_0 k\pi \cos\left(\frac{\pi}{2}d\right)\cos\left(\frac{\pi}{2}b\right) \end{aligned} \quad \text{Formula 28}$$

By substituting the value of "d" (=0) into Formula 28, we obtain Formula 29.

$$\frac{\partial \theta}{\partial B} = \theta_0 k\pi \cos\left(\frac{\pi}{2}b\right) \quad \text{Formula 29}$$

The expression shown by Formula 29 includes a cosine function, $\cos(\pi b/2)$, that is, the sensitivity has periodicity. The sensitivity becomes a maximum where B=0. The maximum value is expressed by Formula 30.

$$\left|\frac{\partial \theta}{\partial B}\right|_{max} = \theta_0 k\pi \quad \text{Formula 30}$$

From Formula 4 in the first embodiment, we obtain the expression for "b" as Formula 31.

$$b = kB = \frac{f_B}{2\gamma} = \frac{4g_I \mu_B B}{h} \cdot \frac{1}{2\gamma} \quad \text{Formula 31}$$

From Formula 31, the expression for "k" is obtained as Formula 32.

$$k = \frac{2g_I \mu_B}{\gamma h} \quad \text{Formula 32}$$

The maximum value of the sensitivity of the polarization rotation ($\partial\theta/\partial B$) to the magnetic field is given by the Formula 33.

$$\left|\frac{\partial \theta}{\partial B}\right|_{max} = \theta_0 \frac{2g_I \mu_B}{\gamma h}\pi \quad \text{Formula 33}$$

(Comparison Between Continuous Excitation and Pulse Excitation)

In the continuous excitation, the maximum of the sensitivity of the polarization rotation ($\partial\theta/\partial B$) to the magnetic field is expressed in Formula 34, which is the same as in Formula 24.

$$\left|\frac{\partial \theta}{\partial B}\right|_{max} = \theta_0 \frac{2g_I \mu_B}{\gamma h} \quad \text{Formula 34}$$

On the other hand, in the pulse excitation, the maximum of the sensitivity of the polarization rotation ($\partial\theta/\partial B$) to the magnetic field is expressed in Formula 35, which is the same as in Formula 33.

$$\left|\frac{\partial \theta}{\partial B}\right|_{max} = \theta_0 \frac{2g_I \mu_B}{\gamma h}\pi \quad \text{Formula 35}$$

Furthermore, we denote the half widths at half maximum in the continuous excitation and in the pulse excitation by $\gamma_{CW}$ and $\gamma_{PL}$, respectively. For the excitations by laser light with high intensity, the half width at half maximum in the continuous excitation is larger than that in the pulse excitation, i.e. $\gamma_{CW} > \gamma_{PL}$. Then, we obtain the relation between the sensitivities in the continuous excitation and in the pulse excitation as Formula 36.

$$\left|\frac{\partial \theta}{\partial B}\right|_{PL,max} > \left|\frac{\partial \theta}{\partial B}\right|_{CW,max} \quad \text{Formula 36}$$

Accordingly, compared with the continuous excitation, the sensitivity of the polarization rotation to the magnetic field in the pulse excitation is high. That is, by narrowing the line width according to the pulse excitation, the sensitivity to a density of magnetic flux can be enhanced.

Further, the present invention is not limited to these embodiments, but various variations and modifications may be made without departing from the scope of the present invention.

The present application is based on and claims the benefit of priorities of Japanese Priority Applications No. 2013-

026436 filed on Feb. 14, 2013 and No. 2014-006073 filed on Jan. 16, 2014, with the Japanese Patent Office, the entire contents of which are hereby incorporated by reference.

What is claimed is:

1. A magnetic sensor, comprising:
an alkali metal cell in which an alkali metal atom is encapsulated;
a light source that emits laser light which enters the alkali metal cell;
a light detector that detects light which has passed through the alkali metal cell; and
a polarizer arranged between the alkali metal cell and the light detector, wherein
a modulation frequency in the light source is controlled, according to a coherent population trapping resonance which is a light absorption characteristic of a quantum interference effect for two kinds of resonant lights, by modulating the light source to generate sidebands and injecting laser lights with two different wavelengths which are the sidebands into the alkali metal cell, wherein the laser light entering the alkali metal cell has a linear polarization, which is polarized in one direction, and the direction of polarization of the laser light entering the alkali metal cell is not parallel to a direction of polarization of the polarizer, and a density of magnetic flux in a direction parallel to a propagating direction of the laser light is detected in response to the coherent population trapping resonance.

2. The magnetic sensor as claimed in claim 1, wherein an intensity of the laser light that enters the alkali metal cell is modulated in a form of a pulse sequence.

3. The magnetic sensor as claimed in claim 1, wherein an intensity of the laser light that enters the alkali metal cells is modulated in a form of a pulse sequence by an optical intensity modulator arranged between the light source and the alkali metal cell.

4. The magnetic sensor as claimed in claim 1, wherein the density of magnetic flux is obtained based on a full width at half maximum of the coherent population trapping resonance.

5. The magnetic sensor as claimed in claim 1, wherein the density of magnetic flux is obtained based on an amplitude of the coherent population trapping resonance.

* * * * *